(12) United States Patent
Liaw

(10) Patent No.: US 11,004,852 B2
(45) Date of Patent: May 11, 2021

(54) SEMICONDUCTOR STRUCTURE

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 22 days.

(21) Appl. No.: 16/256,136

(22) Filed: Jan. 24, 2019

(65) Prior Publication Data
US 2020/0135737 A1  Apr. 30, 2020

Related U.S. Application Data

(60) Provisional application No. 62/752,386, filed on Oct. 30, 2018.

(51) Int. Cl.
| | |
|---|---|
| *H01L 27/092* | (2006.01) |
| *H01L 29/10* | (2006.01) |
| *H01L 29/161* | (2006.01) |
| *H01L 29/78* | (2006.01) |
| *H01L 29/49* | (2006.01) |
| *H01L 29/06* | (2006.01) |
| *H01L 21/8238* | (2006.01) |
| *H01L 29/08* | (2006.01) |
| *H01L 27/11* | (2006.01) |

(52) U.S. Cl.
CPC .. *H01L 27/0928* (2013.01); *H01L 21/823807* (2013.01); *H01L 21/823821* (2013.01); *H01L 21/823892* (2013.01); *H01L 29/0696* (2013.01); *H01L 29/0847* (2013.01); *H01L 29/1033* (2013.01); *H01L 29/161* (2013.01); *H01L 29/4966* (2013.01); *H01L 29/7851* (2013.01); *H01L 27/1104* (2013.01)

(58) Field of Classification Search
CPC ......... H01L 27/0928; H01L 21/823807; H01L 21/823821; H01L 21/823892; H01L 29/0696; H01L 29/0847; H01L 29/1033; H01L 29/161; H01L 29/4966; H01L 29/7851; H01L 27/1104
USPC ........................................................ 257/369
See application file for complete search history.

(56) References Cited

U.S. PATENT DOCUMENTS

| | | | |
|---|---|---|---|
| 2007/0018253 A1* | 1/2007 | Liaw | H01L 27/0203 257/369 |
| 2010/0155855 A1* | 6/2010 | Anderson | H01L 21/823412 257/392 |
| 2011/0042751 A1* | 2/2011 | Kim | H01L 29/7833 257/369 |
| 2013/0292777 A1* | 11/2013 | Liaw | G11C 11/419 257/369 |

(Continued)

*Primary Examiner* — Dzung Tran
(74) *Attorney, Agent, or Firm* — McClure, Qualey & Rodack, LLP

(57) ABSTRACT

Semiconductor structures are provided. A semiconductor structure includes a first P-type transistor including a first SiGe channel region, and a second P-type transistor including a second SiGe channel region. The first SiGe channel region has higher Ge atomic concentration than the second SiGe channel region. The first and second P-type transistors are formed in the same N-type well region.

20 Claims, 19 Drawing Sheets

(56) References Cited

U.S. PATENT DOCUMENTS

| | | | |
|---|---|---|---|
| 2015/0214116 A1* | 7/2015 | Javorka | H01L 29/66651 |
| | | | 438/230 |
| 2016/0020210 A1* | 1/2016 | Liaw | H01L 21/823878 |
| | | | 257/369 |
| 2016/0308032 A1* | 10/2016 | Glass | H01L 29/7849 |

* cited by examiner

|  | MP1 (Higher SiGe concentration in channel region) | MP2 (Lower SiGe concentration in channel region) |
|---|---|---|
| Threshold Voltage | Vt1 | Vt2 |
| Off Current | Ioff1 | Ioff2 |

FIG. 11

| | Higher SiGe concentration in channel region | | Lower SiGe concentration in channel region | |
|---|---|---|---|---|
| | MP1 (first work-function layer) | MP4 (second work-function layer) | MP2 (first work-function layer) | MP5 (second work-function layer) |
| Threshold Voltage | Vt1 | Vt3 | Vt2 | Vt4 |

FIG. 12

SEMICONDUCTOR STRUCTURE

CROSS REFERENCE TO RELATED APPLICATIONS

This Application claims priority of U.S. Provisional Application No. 62/752,386, filed on Oct. 30, 2018, the entirety of which is incorporated by reference herein.

BACKGROUND

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

The recent trend in miniaturizing ICs has resulted in smaller devices which consume less power, yet provide more functionality at higher speeds than before. The miniaturization process has also resulted in various developments in IC designs and/or manufacturing processes to ensure the desired production yield and the intended performance.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIG. 11 shows a table illustrating the relationship of the threshold voltage and the Ge atomic concentration of the first and second PMOS transistors.

FIG. 12 shows a table illustrating the relationship of the threshold voltage and the Ge atomic concentration of the first, second, fourth and fifth PMOS transistors.

DETAILED DESCRIPTION

Figure 1:
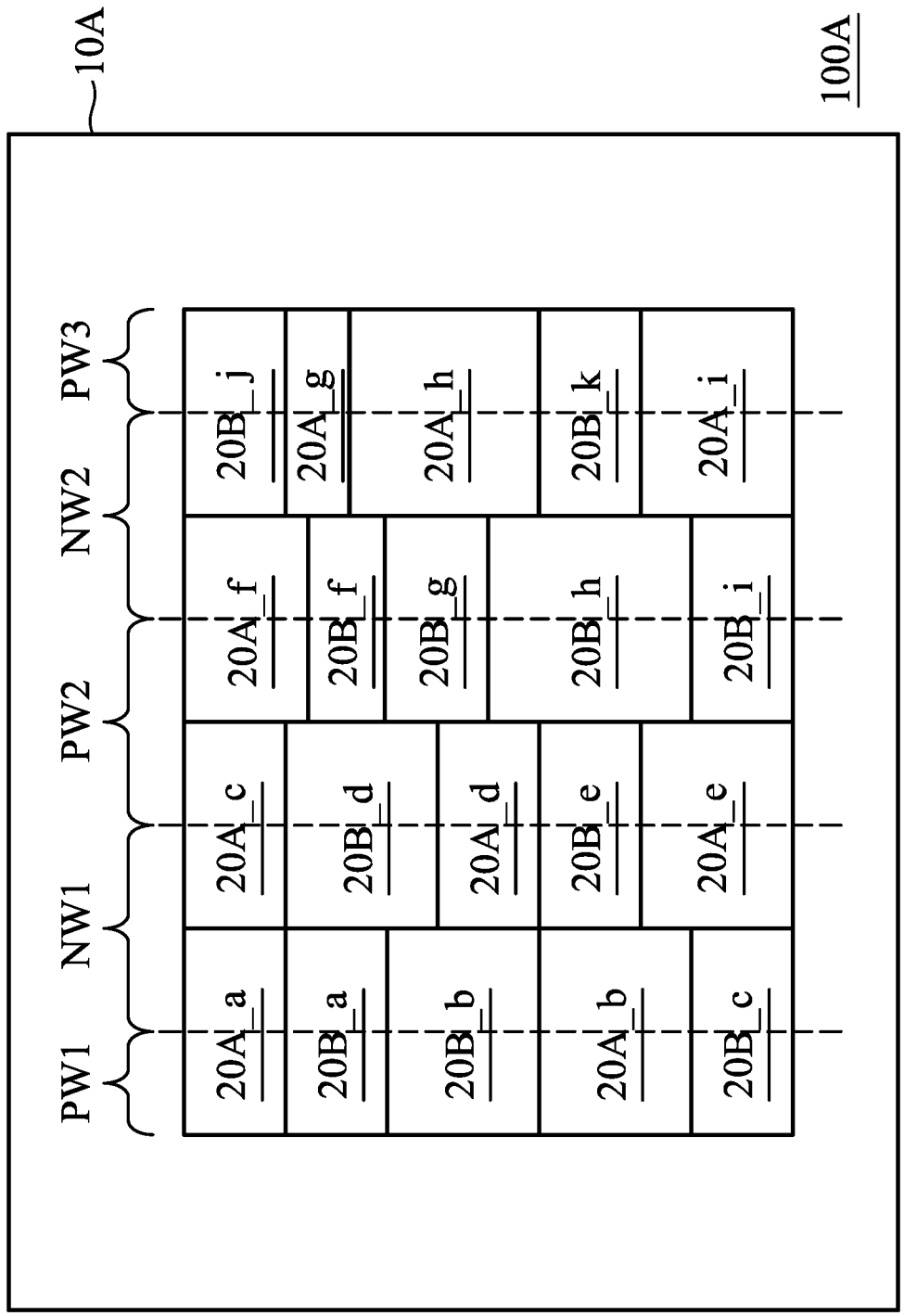
FIG. 1 is a simplified diagram of an IC, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

FIG. 1 is a simplified diagram of an IC 100A, in accordance with some embodiments of the disclosure. A logic circuit 10A of the IC 100A includes multiple first logic cells 20A and multiple second logic cells 20B. For the explanation, the first logic cells 20A are respectively labeled as 20A_a through 20A_i, and the second logic cells 20B are respectively labeled as 20B_a through 20B_k. In some embodiments, the first logic cells 20A and the second logic cells 20B are the standard cells (e.g., inverter (INV), AND, OR, NAND, NOR, Flip-Flop, SCAN, etc.), a combination thereof or specific functional cells. Furthermore, the logic functions of the first logic cells 20A and the second logic cells 20B may be the same or different. Furthermore, each of the first logic cells 20A and the second logic cells 20B includes multiple transistors. In some embodiments, the first logic cells 20A and the second logic cells 20B corresponding to the same function or operation may have the same circuit configuration with different semiconductor structures for providing various threshold voltages (Vth or Vt). For example, the semiconductor structures of the PMOS and/or NMOS transistors of the first logic cells 20A, and the second logic cells 20B are different. In general, the threshold voltage of a field-effect transistor (FET) is the minimum gate-to-source voltage $V_{GS}$ that is needed to create a conducting path between the source and drain regions of the transistor.

In FIG. 1, the first logic cells 20A_a through 20A_i and the second logic cells 20B_a through 20B_k have the same cell width in the layout. In some embodiments, the first logic cells 20A and second logic cells 20B have the same cell height in the layout. Furthermore, the first logic cells 20A and second logic cells 20B may have the same or different cell widths in the layout. It should be noted that the number and the configuration of the first logic cells 20A and second logic cells 20B are used as an example, and not to limit the disclosure.

In some embodiments, the transistors in the first logic cells 20A and second logic cells 20B are selected from a group consisting of FINFET structure, vertical gate all around (GAA), horizontal GAA, nano wire, nano sheet, and a combination thereof.

The first logic cells 20A_a and 20A_b and the second logic cells 20B_a through 20B_c are arranged in a first column of the logic circuit 10A. In the first logic cells 20A_a and 20A_b, the PMOS transistors are formed in an N-type well region NW1, and the NMOS transistors are formed in a P-type well region PW1. Furthermore, in the second logic cells 20B_a through 20B_c, the PMOS transistors are formed in the N-type well region NW1, and the NMOS transistors are formed in the P-type well region PW1.

The first logic cells 20A_c through 20A_e and the second logic cells 20B_d and 20B_e are arranged in a second column of the logic circuit 10A. In the first logic cells 20A_c through 20A_e, the PMOS transistors are formed in the N-type well region NW1, and the NMOS transistors are formed in a P-type well region PW2. Furthermore, in the second logic cells 20B_d and 20B_e, the PMOS transistors are formed in the N-type well region NW1, and the NMOS transistors are formed in the P-type well region PW2.

The first logic cell 20A_f and the second logic cells 20B_f through 20B_i are arranged in a third column of the logic circuit 10A. In the first logic cell 20A_f, the PMOS transistors are formed in an N-type well region NW2, and the NMOS transistors are formed in the P-type well region PW2. Furthermore, in the second logic cells 20B_f through 20B_i, the PMOS transistors are formed in the N-type well region NW2, and the NMOS transistors are formed in the P-type well region PW2.

The first logic cells 20A_g through 20A_i and the second logic cells 20B_j and 20B_k are arranged in a fourth column of the logic circuit 10A. In the first logic cells 20A_g through 20A_i, the PMOS transistors are formed in the N-type well region NW2, and the NMOS transistors are formed in a P-type well region PW3. Furthermore, in the second logic cells 20B_j and 20B_k, the PMOS transistors are formed in the N-type well region NW2, and the NMOS transistors are formed in the P-type well region PW3.

In some embodiments, the logic cells 20A and 20B are electrically isolated by the isolation region, e.g., the shallow trench isolation (STI). In some embodiments, the logic cells 20A and 20B are electrically isolated by the transistors.

Figure 2:
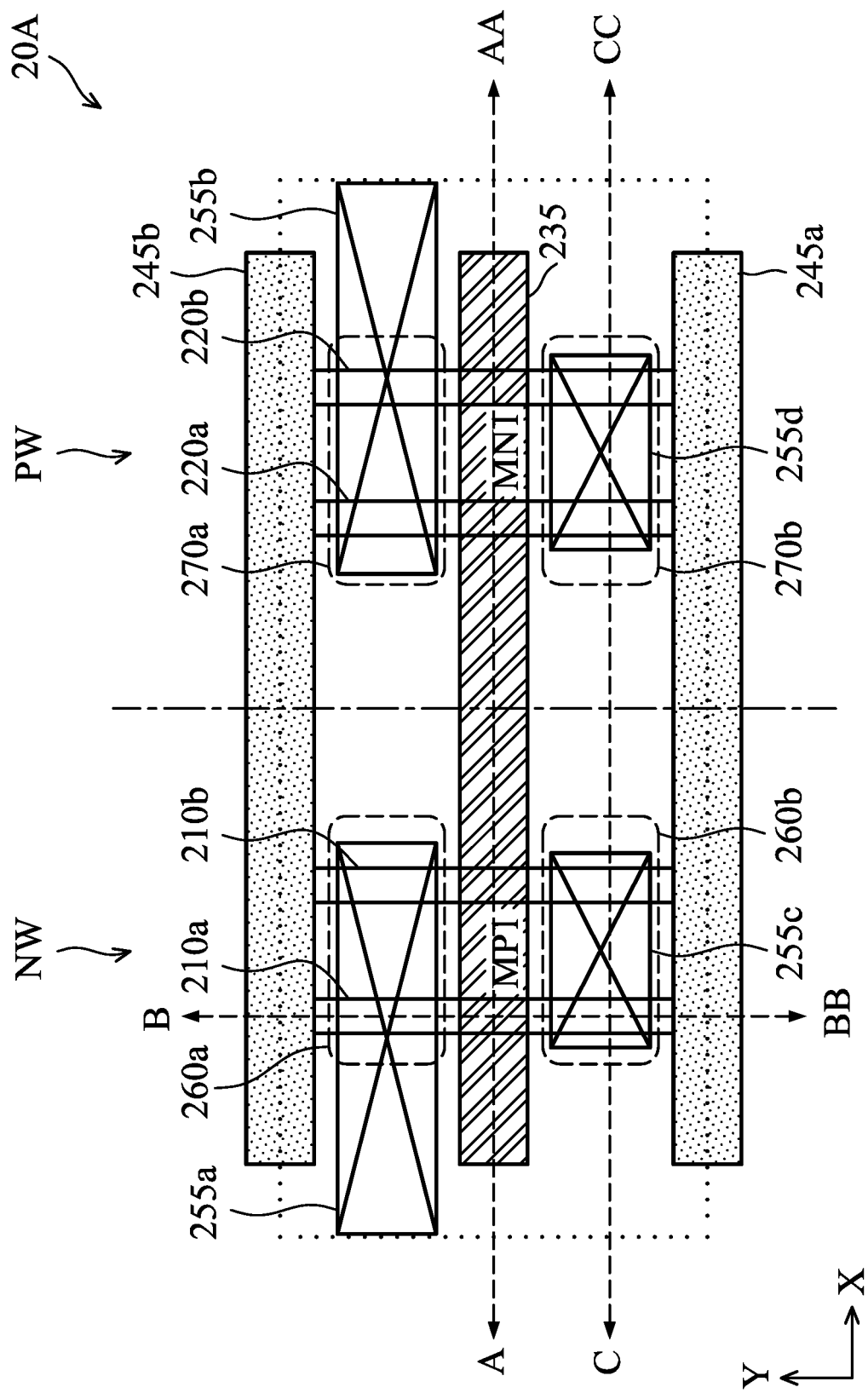
FIG. 2 illustrates a layout of the semiconductor structure of the first logic cell, in accordance with some embodiments of the disclosure.

FIG. 2 illustrates a layout of the semiconductor structure of the first logic cell 20A, in accordance with some embodiments of the disclosure. In FIG. 2, the first logic cell 20A includes the first PMOS transistor MP1 and the first NMOS transistor MN1. The first PMOS transistor MP1 and the first NMOS transistor MN1 are dual-fin FETs. In order to simplify the description, only the transistors MP1 and MN1 are shown in FIG. 2A. In some embodiments, the first logic cell 20A includes multiple NMOS transistors MP1 and multiple NMOS transistors MN1. Furthermore, an outer boundary of the first logic cell 20A is illustrated using dashed lines.

In the first logic cell 20A, the semiconductor fins 210a and 210b extending in the Y-direction are formed over the N-type well region NW, and the semiconductor fins 220a and 220b extending in the Y-direction are formed over the P-type well region PW. A gate electrode 235 extending in the X-direction forms the first PMOS transistor MP1 with an underlying active region formed by the semiconductor fins 210a and 210b over the N-type well region NW. Furthermore, the gate electrode 235 forms the first NMOS transistor MN1 with an underlying active region formed by the semiconductor fins 220a and 220b in the P-type well region PW. In other words, the gate electrode 235 is shared by the first NMOS transistor MN1 and the first PMOS transistor MP1. In some embodiments, the gate electrode 235 is coupled to a conductive line (not shown) extending in the Y-direction through a gate contact (not shown) and a via (not shown), and the conductive line is configured to connect the gate electrode 235 to an overlying level for receiving signal.

In the first logic cell 20A, the dielectric-base gates 245a and 245b extending in the X-direction are dummy gates. The gate electrode 235 is arranged between the dielectric-base dummy gates 245a and 245b, and the first NMOS transistor MN1 and the first PMOS transistor MP1 are surrounded by the dielectric-base dummy gates 245a and 245b.

In the first logic cell 20A, the source/drain region 260a of the first PMOS transistor MP1 is coupled to an overlying level through the contact 255a. Furthermore, the source/drain region 260b of the first PMOS transistor MP1 is coupled to an overlying level through the contact 255c. Similarly, the source/drain region 270a of the first NMOS transistor MN1 is coupled to an overlying level through the contact 255b. Moreover, the source/drain region 270b of the first NMOS transistor MN1 is coupled to an overlying level through the contact 255d.

Figure 3A:
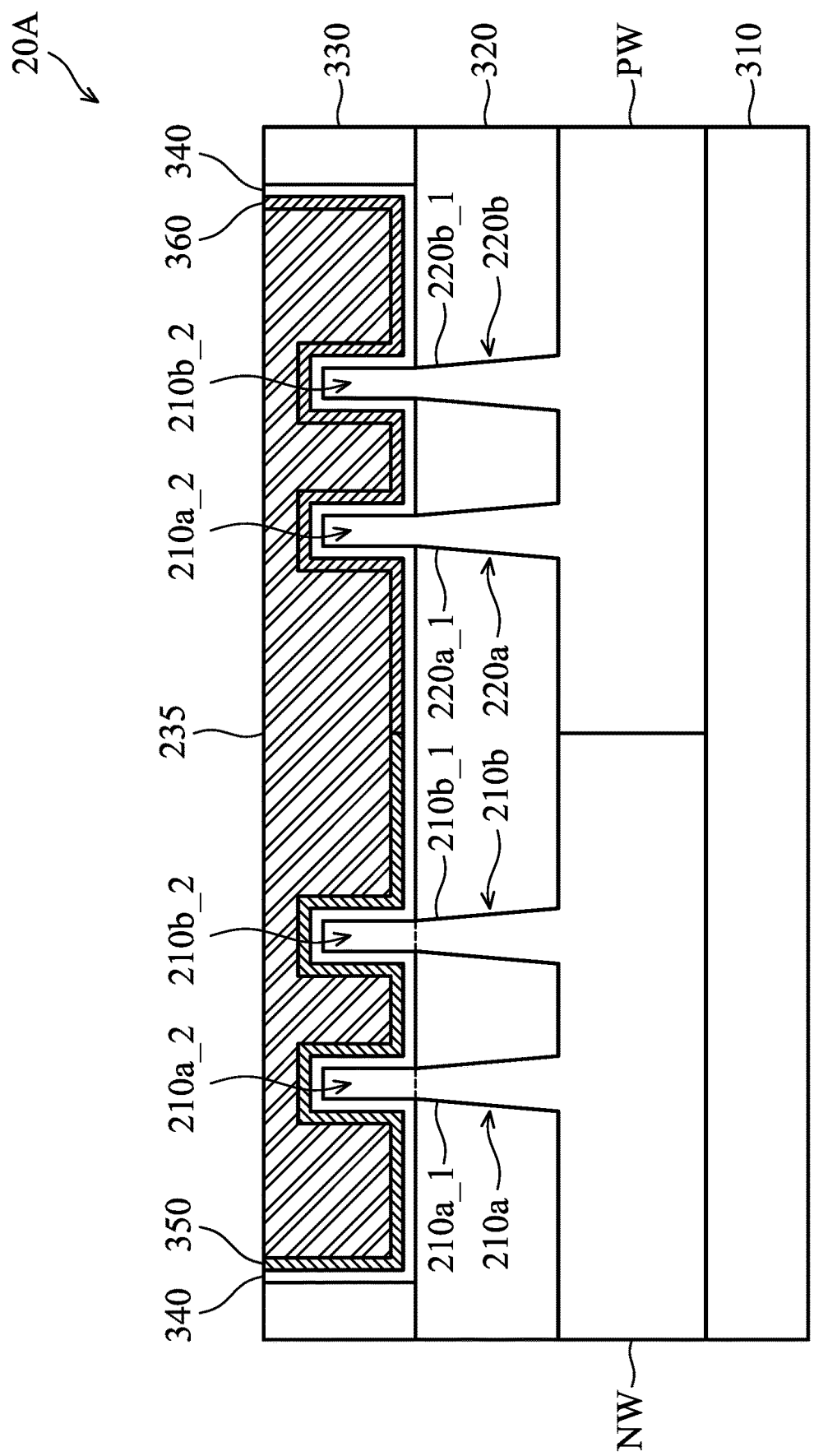
FIG. 3A illustrates a cross-sectional view of the semiconductor structure of the first logic cell along line A-AA in FIG. 2, in accordance with some embodiments of the disclosure.

FIG. 3A illustrates a cross-sectional view of the semiconductor structure of the first logic cell 20A along line A-AA in FIG. 2, in accordance with some embodiments of the disclosure. The P-type well region PW and the N-type well region NW are formed over a substrate 310. In some embodiments, the substrate 310 is a Si substrate. In some embodiments, the material of the substrate 310 is selected from a group consisting of bulk-Si, SiP, SiGe, SiC, SiPC, Ge, SOI—Si, SOI—SiGe, III-VI material, and a combination thereof.

The semiconductor fins 210a and 210b are formed on the N-type well region NW. The semiconductor fins 210a and 210b are separated from each other by the shallow trench isolation (STI) 320. In some embodiments, the semiconductor fins 210a and 210b include an appropriate concentration of n-type dopants (e.g., phosphorous (such as 31P), arsenic, or a combination thereof). The semiconductor fin 210a includes a first portion 210a_1 and a second portion 210a_2. Compared with the first portion 210a_1, the second portion 210a_2 further includes SiGe content. Similarly, the semiconductor fin 210b includes a first portion 210b_1 and a second portion 210b_2. Compared with the first portion 210b_1, the second portion 210b_2 further includes SiGe content. In some embodiments, the Ge atomic concentration of the second portions 210a_2 and 210b_2 is within a range of 15%~35%. In some embodiments, the Ge atomic concentration of the second portions 210a_2 and 210b_2 is within a range of 10.5%~35%. In some embodiments, the second portions 210a_2 and 210b_2 are formed by performing a dielectric deposition, patterning to expose the predetermined channel region and following a first SiGe concentration epi-growth on exposed channel region.

The semiconductor fins 220a and 220b are formed on the P-type well region PW. In some embodiments, the semiconductor fins 220a and 220b include an appropriate concentration of P-type dopants (e.g., boron (such as 11B), boron, boron fluorine ($BF_2$), or a combination thereof). Furthermore, the semiconductor fins 220a and 220b are separated from each other by the STI 320. The semiconductor fin 220a includes a first portion 220a_1 and a second portion 220a_2 formed by the same material. Similarly, the semiconductor fin 220b includes a first portion 220b_1 and a second portion 220b_2 formed by the same material. Compared with the semiconductor fins 210a and 210b, the semiconductor fins 220a and 220b do not include Ge content.

The gate electrode 235 is formed over the gate dielectric layer 340 and is positioned over a top surface of the semiconductor fins 210a, 210b, 220a and 220b. In some embodiments, the thickness of the gate dielectric layer 340 is within a range of 0.5 nm through 3 nm. In some embodiments, the spacers 330 are formed on opposite sides of the gate electrode 235. The spacers 330 may be formed by a single layer or multiple layers. Each of the semiconductor fins 210a and 210b overlapping the gate electrode 235, e.g., the second portions 210a_2 and 210b_2, may serve as a SiGe channel region of the first PMOS transistor MP1. Thus, the gate electrode 235 and the gate dielectrics 340 over the semiconductor fins 210a and 210b form a gate structure for the first PMOS transistor MP1. Furthermore, each of the semiconductor fins 220a and 220b overlapping the gate electrode 235, e.g., the second portions 220a_2 and 220b_2, may serve as a Si-base channel region of the first NMOS transistor MN1. Thus, the gate electrode 235 and the gate dielectrics 340 over the semiconductor fins 220a and 220b form a gate structure for the first NMOS transistor MN1. In some embodiments, the gate electrode layer 235 is made of conductive material, such as aluminum (Al), copper (Cu), tungsten (W), titanium (Ti), tantalum (Ta), or other applicable materials.

The gate dielectric layer 340 may be a single layer or multiple layers. The gate dielectric layer 340 is made of silicon oxide (SiOx), silicon nitride (SixNy), silicon oxynitride (SiON), dielectric material(s) with high dielectric constant (high-k), or a combination thereof. In some embodiments, the gate dielectric layer 340 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Az_2O_3$), titanium oxide ($TiO_2$) or another applicable material.

A work-function layer 350 is between the gate dielectric layer 340 and the gate electrode 235 over the N-type well region NW. Furthermore, the SiGe channel region of the first PMOS transistor MP1 is covered by the work-function layer 350. In some embodiments, the work-function layer 350 includes a P-type work-function metal. The P-type work-function metal includes titanium nitride (TiN), tungsten nitride (WN), tantalum nitride (TaN), ruthenium (Ru) or a combination thereof.

A work-function layer 360 is between the gate dielectric layer 340 and the gate electrode 235 over the P-type well region PW. Furthermore, the Si-base channel region of the first NMOS transistor MN1 is covered by the work-function layer 360. In some embodiments, the work-function layer 360 includes an N-type work-function metal. The N-type work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof.

In some embodiments, the work-function layers 350 and 360 include multiple layers combination and selected from a group of TiN, TaN, TiAl, TiAlN, W, or a combination thereof. In some embodiments, the work-function layers 350 and 360 are formed by multiple patterns and multiple metal deposition for multiple work-function scheme.

In some embodiments, the SiGe channel of the PMOS transistor can further extend the threshold voltage tuning range, so as to allow the same work-function material for both NMOS and PMOS transistors for various threshold voltage requirements.

Figure 3B:
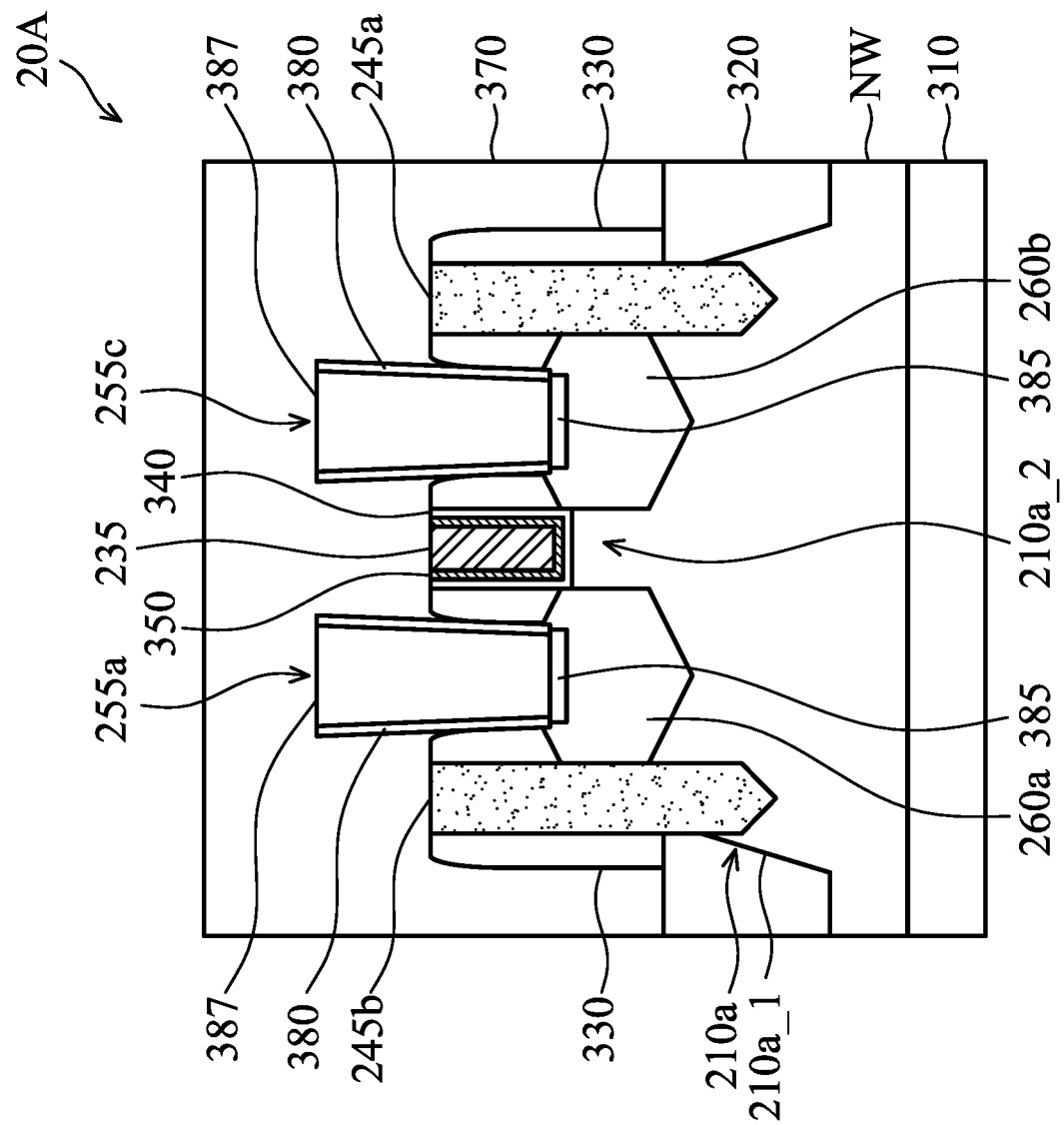
FIG. 3B illustrates a cross-sectional view of the semiconductor structure of the first logic cell along line B-BB in FIG. 2, in accordance with some embodiments of the disclosure.

FIG. 3B illustrates a cross-sectional view of the semiconductor structure of the first logic cell 20A along line B-BB in FIG. 2, in accordance with some embodiments of the disclosure. The N-type well region NW is formed over the substrate 310. The semiconductor fin 210a is formed on the N-type well region NW, and is surrounded by the STI 320. As described above, the semiconductor fin 210a includes the first portion 210a_1 and the second portion 210a_2.

The Inter-Layer Dielectric (ILD) layer 370 is formed over the STI 320. In some embodiments, the ILD layer 370 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The source/drain regions 260a and 260b are formed on the first portion 210a_1 of the semiconductor fin 210a. In some embodiments, the source/drain regions 260a and 260b include SiGe with Boron (e.g., $B_{11}$) dopant. In some embodiments, the Ge atomic concentration of the source/drain regions 260a and 260b is higher than the Ge atomic concentration of the second portion 210a_2 of the semiconductor fin 210a. In some embodiments, the Ge atomic concentration of the source/drain regions 260a and 260b is within a range of 36% through 85%. Furthermore, the source/drain silicide regions 385 are formed on the source/drain regions 260a and 260b. The contacts 255a and 255c are formed on the source/drain silicide regions 385. Each of the contacts 255a and 255c includes a metal plug 387 and a dielectric 380 formed on the sidewall of the metal plug 387, and the metal plug 387 is surrounded by the dielectric 380.

For the first PMOS transistor MP1, the SiGe channel region corresponding to the second portion 210a_2 of the semiconductor fin 210a is formed between the source/drain regions 260a and 260b and under the gate electrode 235. Furthermore, the dielectric-base gates 245a and 245b are located upon the edge of the semiconductor fin 210a. For example, the dielectric-base gate 245b is arranged upon the left edge of the semiconductor fin 210a, and the dielectric-base gate 245a is arranged upon the right edge of the semiconductor fin 210a. Furthermore, the dielectric-base gates 245a and 245b are deeper than the source/drain regions 260a and 260b. In some embodiments, the source/drain regions 260a and 260b have wider width than the SiGe channel region corresponding to the second portion 210a_2 of the semiconductor fin 210a.

In some embodiments, a channel width of the SiGe channel region of the first PMOS transistor MP1 is within a range of 3 nm through 10 nm. Similarly, a channel width of the Si-base channel region of the first NMOS transistor MN1 is within a range of 3 nm through 10 nm.

In some embodiments, the channel sidewall depth of the SiGe channel region of the first PMOS transistor MP1 is within a range of 35 nm through 90 nm. Similarly, the channel sidewall depth of the SiGe channel region of the first NMOS transistor MN1 is within a range of 35 nm through 90 nm.

Figure 3C:
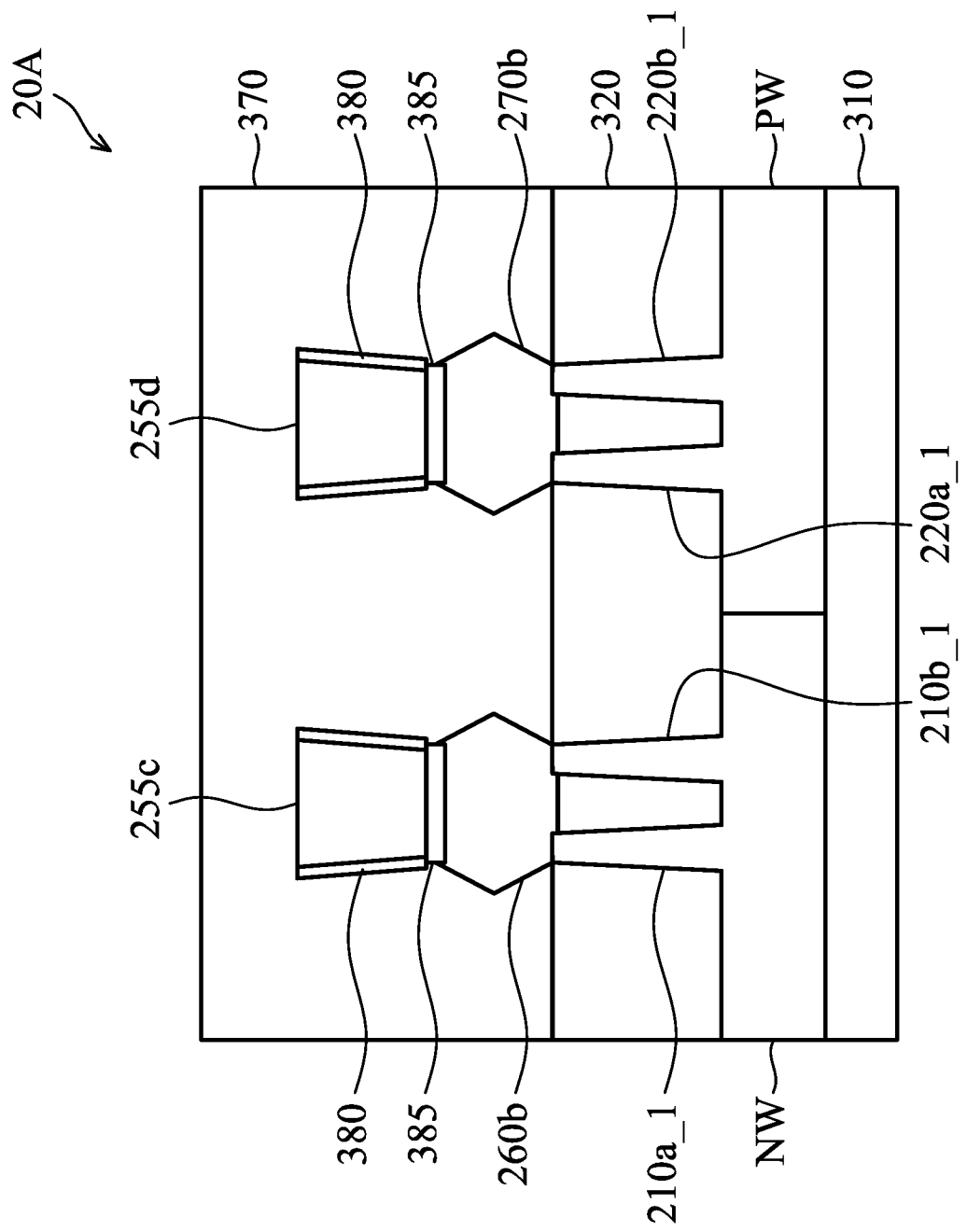
FIG. 3C illustrates a cross-sectional view of the semiconductor structure of the first logic cell along line C-CC in FIG. 2, in accordance with some embodiments of the disclosure.

FIG. 3C illustrates a cross-sectional view of the semiconductor structure of the first logic cell 20A along line C-CC in FIG. 2, in accordance with some embodiments of the disclosure. The P-type well region PW and the N-type well region NW are formed over the substrate 310. The first portions 210a_1 and 210b_1 of the semiconductor fins 210a and 210b are formed on the N-type well region NW. The first portions 220a_1 and 220b_1 of the semiconductor fins 220a and 220b are formed on the P-type well region PW. The semiconductor fins 210a, 210b, 220a and 220b are separated from each other by the STI 320.

The ILD 370 is formed over the STI 320 and the semiconductor fins 210a, 210b, 220a and 220b. The source/drain region 270b is formed on the first portions 220a_1 and 220b_1 of the semiconductor fins 220a and 220b. The source/drain silicide region 385 is formed on the source/drain region 270b of the first NMOS transistor MN1. In some embodiments, the source/drain region 270b includes Si with $P_{31}$ dopant. In some embodiments, the source/drain region 270b is formed by epitaxy material, and the epitaxy material is selected from a group consisting of SiP content, SiC content, SiPC, SiAs, Si, and a combination thereof.

The source/drain region 260b is formed on the first portions 210a_1 and 210b_1 of the semiconductor fins 210a and 210b. The source/drain silicide region 385 is formed on the source/drain region 260b of the first PMOS transistor MP1. In some embodiments, the source/drain region 260b includes SiGe with $B_{11}$ dopant. In some embodiments, the source/drain region 260b is formed by epitaxy material, and the epitaxy material is selected from a group consisting of SiGe, SiGeC, Ge, Si, and a combination thereof.

Figure 4:
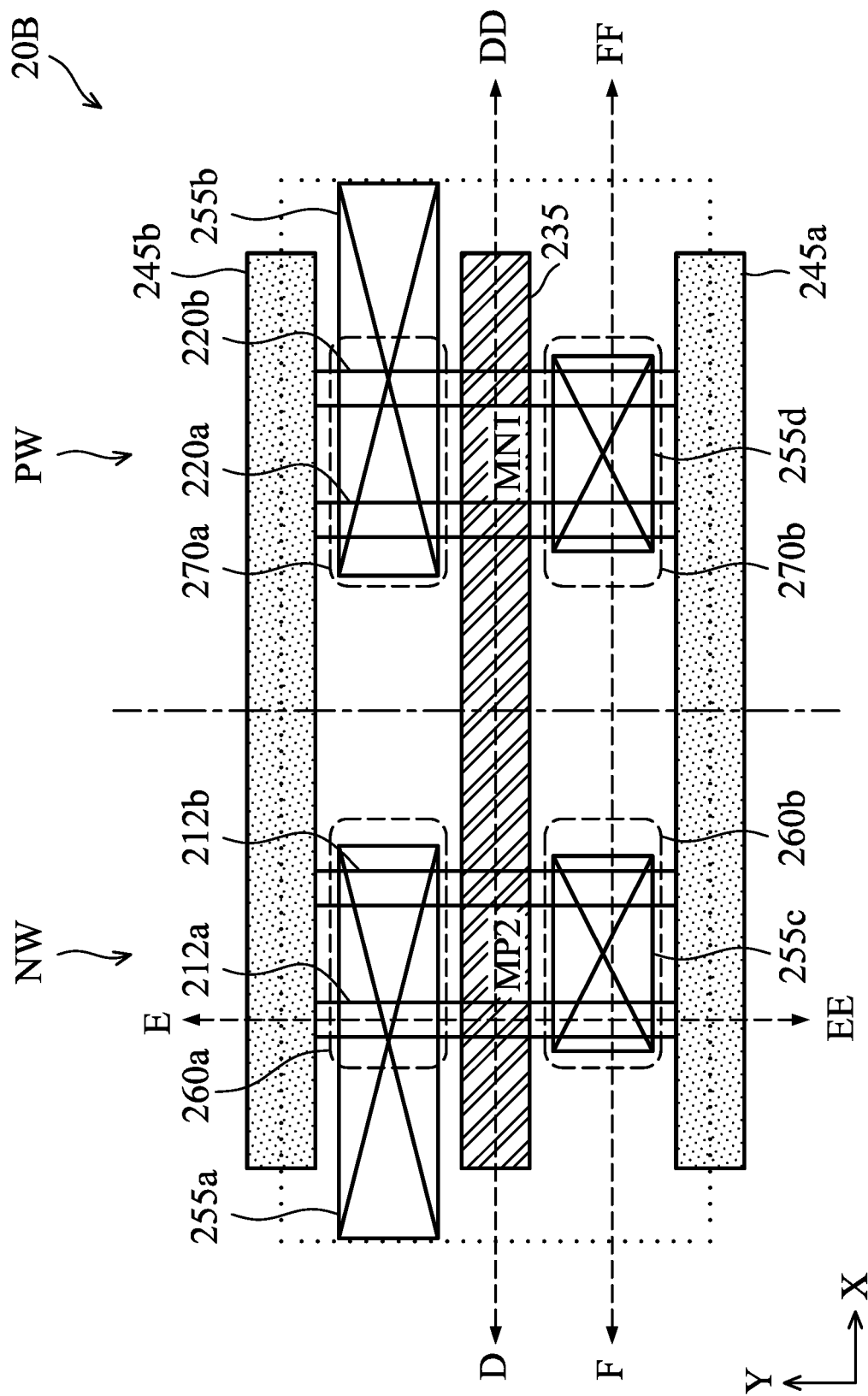
FIG. 4 illustrates a layout of the semiconductor structure of the second logic cell, in accordance with some embodiments of the disclosure.

FIG. 4 illustrates a layout of the semiconductor structure of the second logic cell 20B, in accordance with some embodiments of the disclosure. The semiconductor structure of the second logic cell 20B of FIG. 4 is similar to the semiconductor structure of the first logic cell 20A of FIG. 2, and the difference between FIG. 4 and FIG. 2 is that the second PMOS transistor MP2 with an underlying active region formed by the semiconductor fins 212a and 212b over the N-type well region NW as shown in FIG. 4. In some embodiments, the semiconductor fins 212a and 212b corresponding to the second PMOS transistor MP2 in FIG. 4 and the semiconductor fins 210a and 210b corresponding to the first PMOS transistor MP1 in FIG. 2 have different Ge atomic concentrations.

Figure 5A:
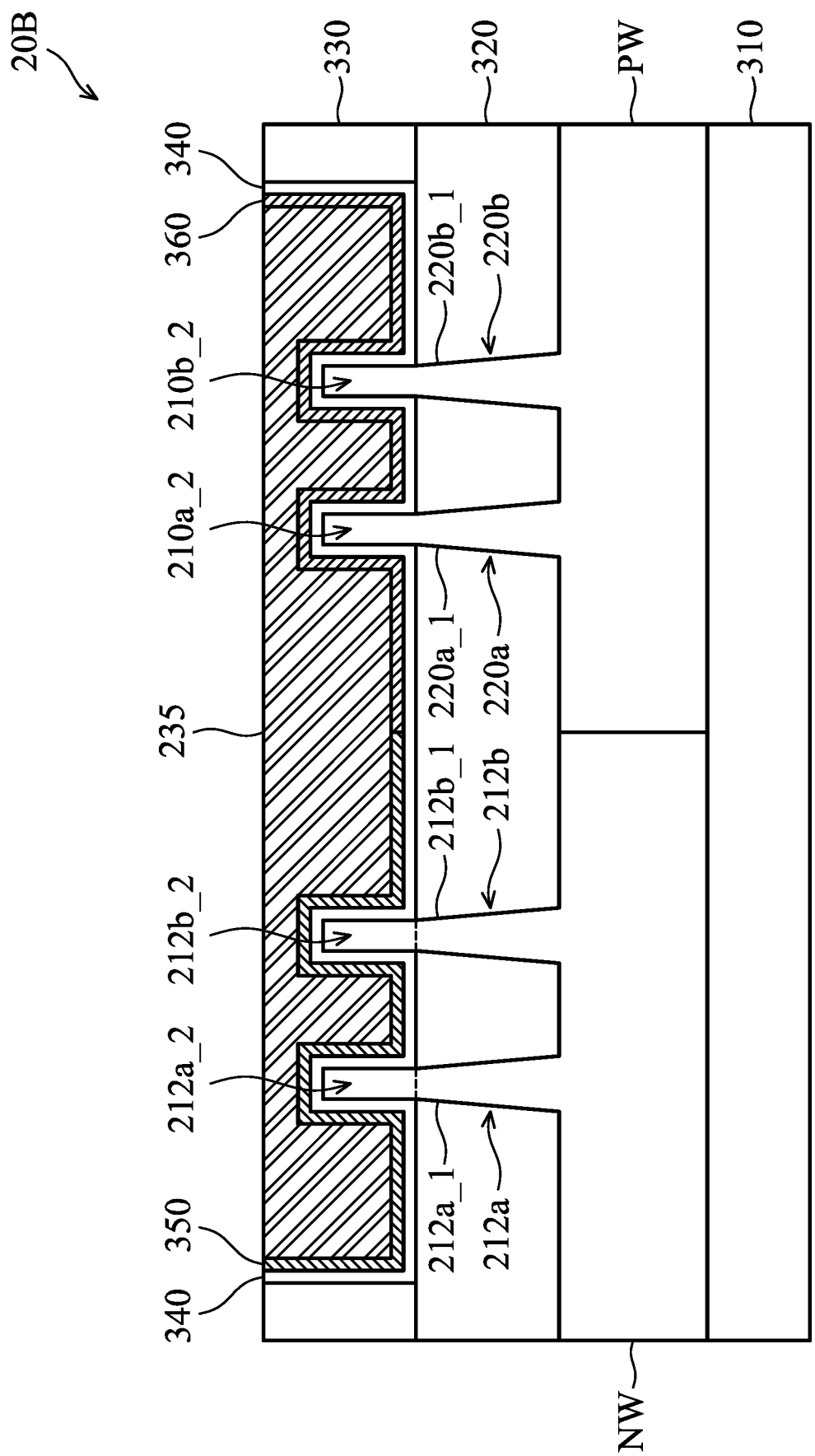
FIG. 5A illustrates a cross-sectional view of the semiconductor structure of the second logic cell along line D-DD in FIG. 4, in accordance with some embodiments of the disclosure.

FIG. 5A illustrates a cross-sectional view of the semiconductor structure of the second logic cell 20B along line D-DD in FIG. 4, in accordance with some embodiments of the disclosure. The semiconductor structure of the second logic cell 20B of FIG. 5A is similar to the semiconductor structure of the first logic cell 20A of FIG. 3A, and the difference between FIG. 5A and FIG. 3A is that the semiconductor fins 212a and 212b are formed on the N-type well region NW as shown in FIG. 5A. The semiconductor fin 212a includes a first portion 212a_1 and a second portion 212a_2. Compared with the first portion 212a_1, the second portion 212a_2 further includes SiGe content. Similarly, the semiconductor fin 212b includes a first portion 212b_1 and a second portion 212b_2. Compared with the first portion 212b_1, the second portion 212b_2 further includes SiGe content. In some embodiments, the Ge atomic concentration of the second portions 212a_2 and 212b_2 is within a range of 5%~14.5%. In some embodiments, the Ge atomic concentration of the second portions 212a_2 and 212b_2 is within a range of 3% 10%. Furthermore, compared with the first PMOS transistor MP1 in FIG. 3A, the Ge atomic concentration of the second portions 212a_2 and 212b_2 of the semiconductor fins 212a and 212b is less than that of the second portions 210a_2 and 210b_2 of the semiconductor fins 210a and 210b for the second PMOS transistor MP2 in FIG. 5A. In some embodiments, the second portions 212a_2 and 212b_2 are formed by performing a dielectric deposition, patterning to expose the predetermined channel region and following a second SiGe concentration epi-growth on exposed channel region.

Referring to FIG. 3A and FIG. 5A together, the Ge atomic concentration of the second portions 210a_2 and 210b_2 of the semiconductor fins 210a and 210b in FIG. 3A is higher than that of the second portions 212a_2 and 212b_2 of the semiconductor fins 212a and 212b in FIG. 5A, and is at least higher than 5%.

Figure 5B:
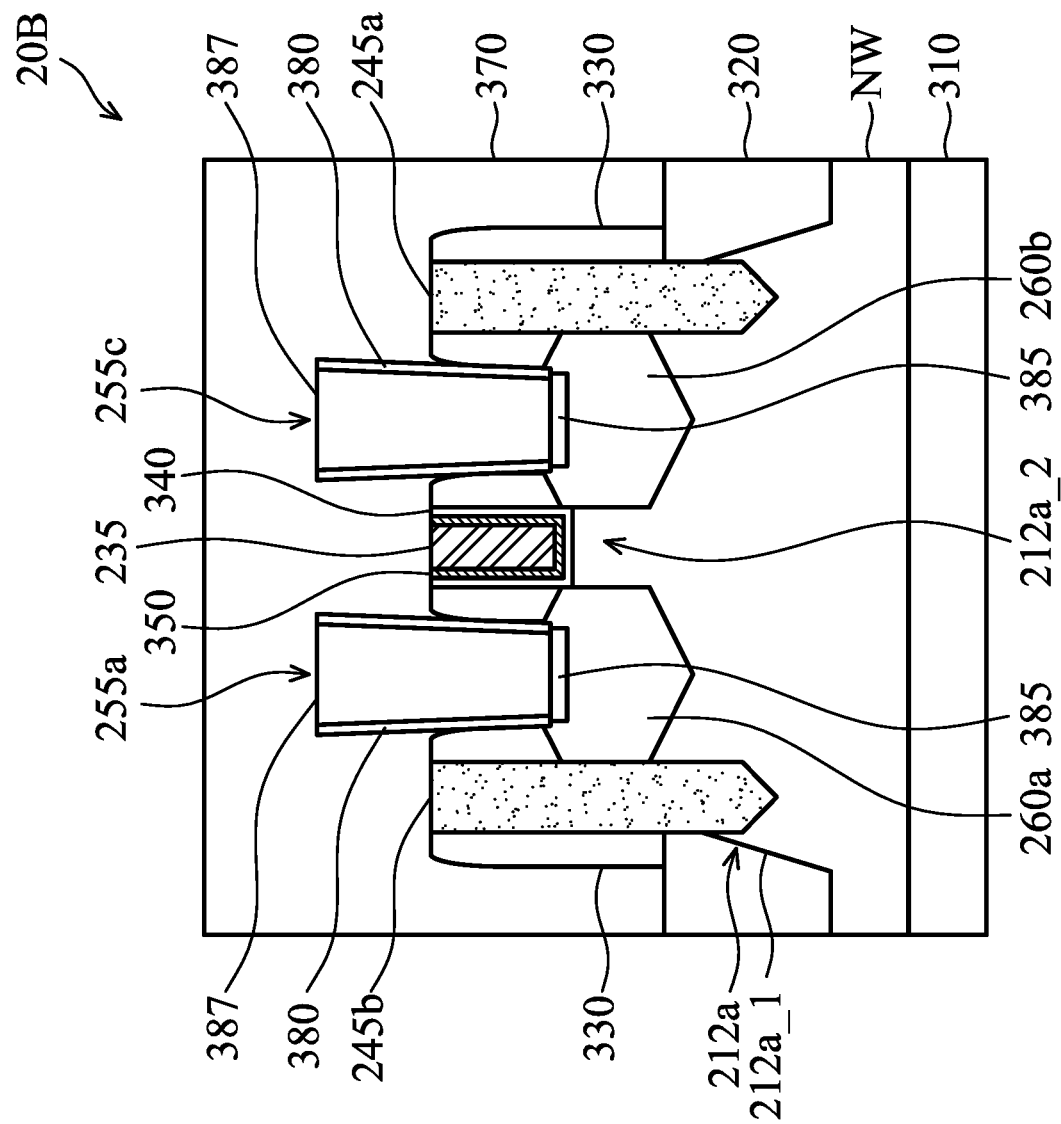
FIG. 5B illustrates a cross-sectional view of the semiconductor structure of the second logic cell along line E-EE in FIG. 4, in accordance with some embodiments of the disclosure.

FIG. 5B illustrates a cross-sectional view of the semiconductor structure of the second logic cell 20B along line E-EE in FIG. 4, in accordance with some embodiments of the disclosure. The semiconductor structure of the second logic cell 20B of FIG. 5B is similar to the semiconductor structure of the first logic cell 20A of FIG. 3B, and the difference between FIG. 5B and FIG. 3B is that the SiGe channel region corresponding to the second portion 212a_2 of the semiconductor fin 212a is formed between the source/drain regions 260a and 260b and under the gate electrode 235 as shown in FIG. 5B.

Referring to FIG. 3B and FIG. 5B together, in some embodiments, the Ge atomic concentration of the SiGe channel region corresponding to the second portion 210a_2 of FIG. 3B is within a range of 15% through 35%, and the Ge atomic concentration of the SiGe channel region corresponding to the second portion 212a_2 of FIG. 5B is within a range of 5% through 14.5%. In some embodiments, the Ge atomic concentration of the SiGe channel region corresponding to the second portion 210a_2 of FIG. 3B is within a range of 10.5% through 35%, and the Ge atomic concentration of the SiGe channel region corresponding to the second portion 212a_2 of FIG. 5B is within a range of 3% through 10%.

In some embodiments, the first PMOS transistor MP1 of the first logic cell 20A and the second PMOS transistor MP2 of the second logic cell 20B have the same gate structure, such as the gate pitch, the gate critical dimension (CD), the gate dielectric layer (e.g., 340 of FIGS. 3B and 5B), and the work-function layer (e.g., 350 of FIGS. 3B and 5B).

Figure 5C:
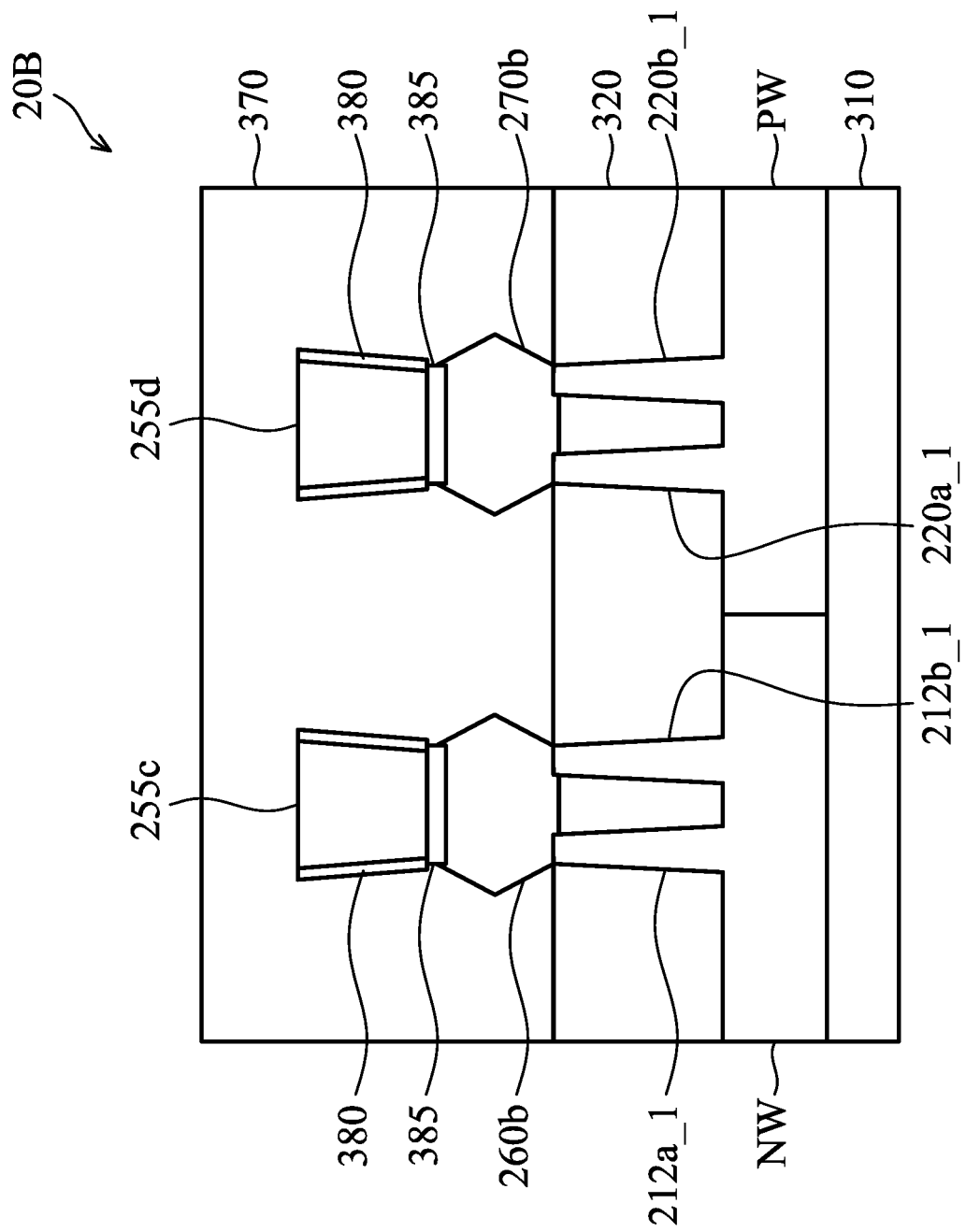
FIG. 5C illustrates a cross-sectional view of the semiconductor structure of the second logic cell along line F-FF in FIG. 4, in accordance with some embodiments of the disclosure.

FIG. 5C illustrates a cross-sectional view of the semiconductor structure of the second logic cell 20B along line F-FF in FIG. 4, in accordance with some embodiments of the disclosure. The semiconductor structure of the second logic cell 20B of FIG. 5C is similar to the semiconductor structure of the first logic cell 20A of FIG. 3C, and the difference between FIG. 5C and FIG. 3C is that the source/drain region 260b is formed on the first portions 212a_1 and 212b_1 of the semiconductor fins 212a and 212b as shown in FIG. 5B.

In some embodiments, the second PMOS transistor MP2 with lower Ge atomic concentration of the SiGe channel region can be implemented in a SRAM cell of the IC 100A. For example, the second PMOS transistor MP2 can be used as the pull-up transistor in a 6T SRAM cell. In some embodiments, the second PMOS transistor MP2 with lower Ge atomic concentration of the SiGe channel region can be implemented in an I/O cell of the IC 100A.

Figure 6:
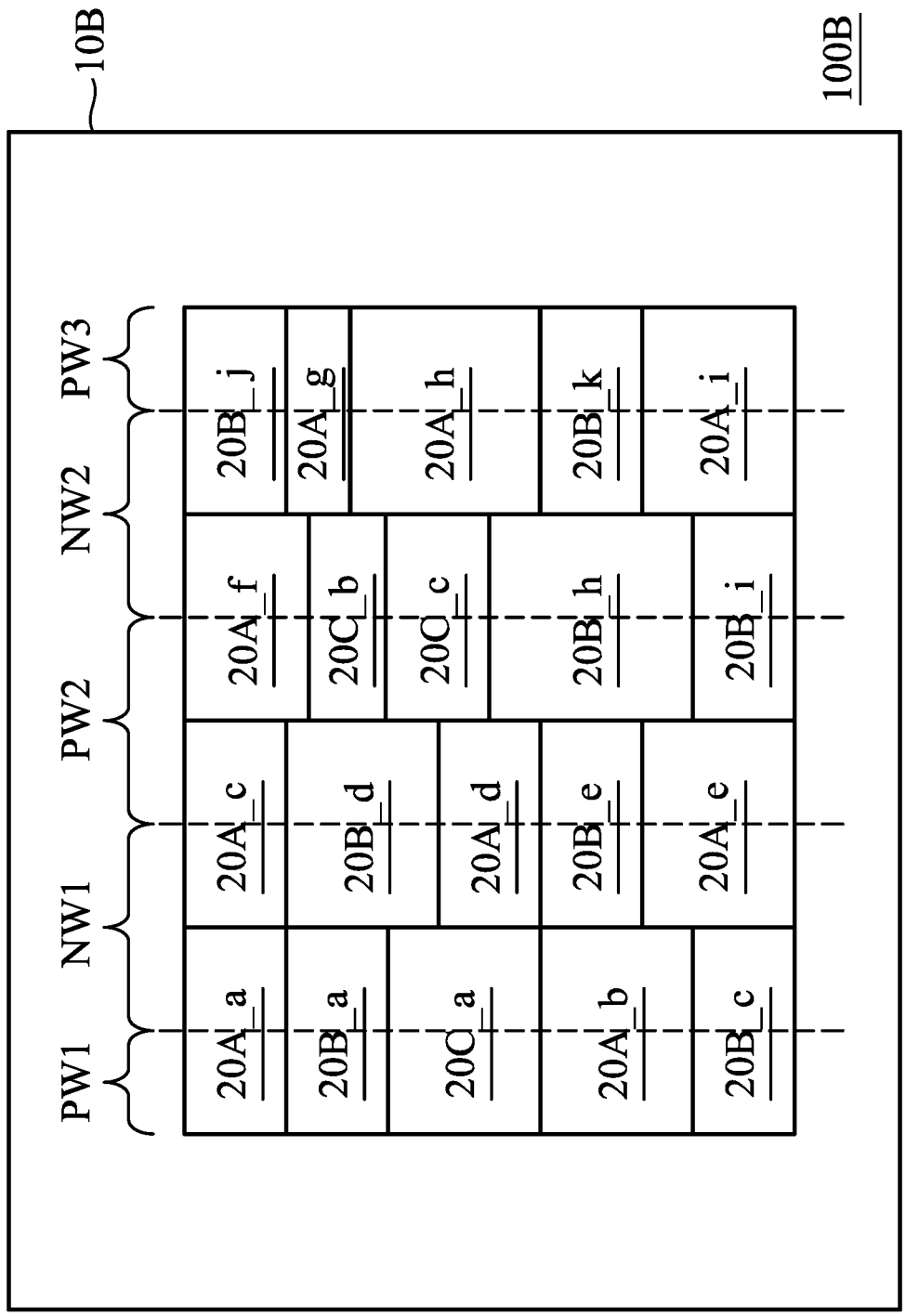
FIG. 6 is a simplified diagram of an IC, in accordance with some embodiments of the disclosure.

FIG. 6 is a simplified diagram of an IC 100B, in accordance with some embodiments of the disclosure. A logic circuit 10B of the IC 100B includes multiple first logic cells 20A, multiple second logic cells 20B, and multiple third logic cells 20C. For the explanation, the first logic cells 20A are respectively labeled as 20A_a through 20A_i, the second logic cells 20B are respectively labeled as 20B_a through 20B_k, and the third logic cells 20C are respectively labeled as 20C_a through 20C_c. The cell arrangement of the logic circuit 10B of FIG. 6 is similar to the cell arrangement of the logic circuit 10A of FIG. 1, and the difference between FIG. 6 and FIG. 1 is that the second logic cells 20B_b, 20B_f and 20B_e are respectively replaced with the third logic cells 20C_a through 20C_c as shown in FIG. 6.

In FIG. 6, the logic functions of the first logic cells 20A, the second logic cells 20B, and the third logic cells 20C may be the same or different. In some embodiments, the first logic cells 20A, the second logic cells 20B and the third logic cells 20C corresponding to the same function or operation may have the same circuit configuration with different semiconductor structures for providing various threshold voltages (Vth or Vt). For example, the semiconductor structures of the PMOS and/or NMOS transistors of the first logic cells 20A, the second logic cells 20B and the third logic cells 20C are different.

The first logic cells 20A_a and 20A_b, the second logic cells 20B_b and 20B_c, and the third logic cell 20C_a are arranged in a first column of the logic circuit 10B. In the third logic cell 20C_a, the PMOS transistors are formed in the N-type well region NW1, and the NMOS transistors are formed in the P-type well region PW1. Thus, the PMOS and NMOS transistors of the first logic cells 20A_a and 20A_b, the second logic cells 20B_b and 20B_c, and the third logic cell 20C_a are formed in the same N-type well region NW1 and the same P-type well region PW1, respectively.

The first logic cell 20A_f, the second logic cells 20B_h and 20B_i, and the third logic cells 20C_b and 20C_c are arranged in a third column of the logic circuit 10B. Thus, the PMOS and NMOS transistors of the first logic cells 20A_f, the second logic cells 20B_h and 20B_i, and the third logic cells 20C_b and 20C_c are formed in the same N-type well region NW2 and the same P-type well region PW2, respectively.

In some embodiments, the logic cells 20A, 20B and 20C are electrically isolated by the isolation region, e.g., STI. In some embodiments, the logic cells 20A, 20B and 20C are electrically isolated by the transistors.

Figure 7:
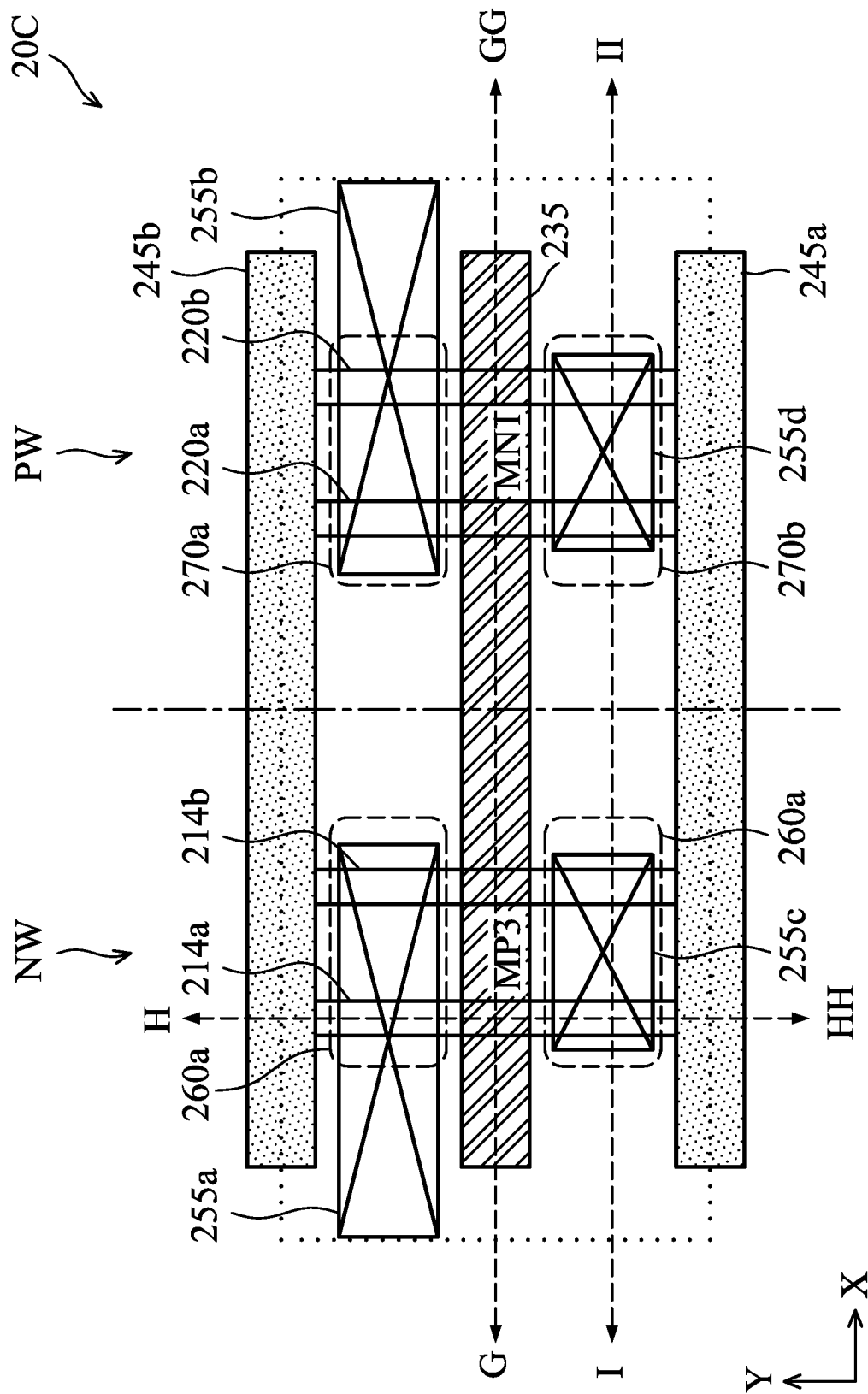
FIG. 7 illustrates a layout of the semiconductor structure of the third logic cell, in accordance with some embodiments of the disclosure.

FIG. 7 illustrates a layout of the semiconductor structure of the third logic cell 20C, in accordance with some embodiments of the disclosure. The semiconductor structure of the third logic cell 20C of FIG. 7 is similar to the semiconductor structure of the first logic cell 20A of FIG. 2, and the difference between FIG. 7 and FIG. 2 is that the third PMOS transistor MP3 with an underlying active region formed by the semiconductor fins 214a and 214b over the N-type well region NW as shown in FIG. 7. In some embodiments, no Ge atomic is present in the semiconductor fins 214a and 214b corresponding to the third PMOS transistor MP3 in FIG. 7.

Figure 8A:
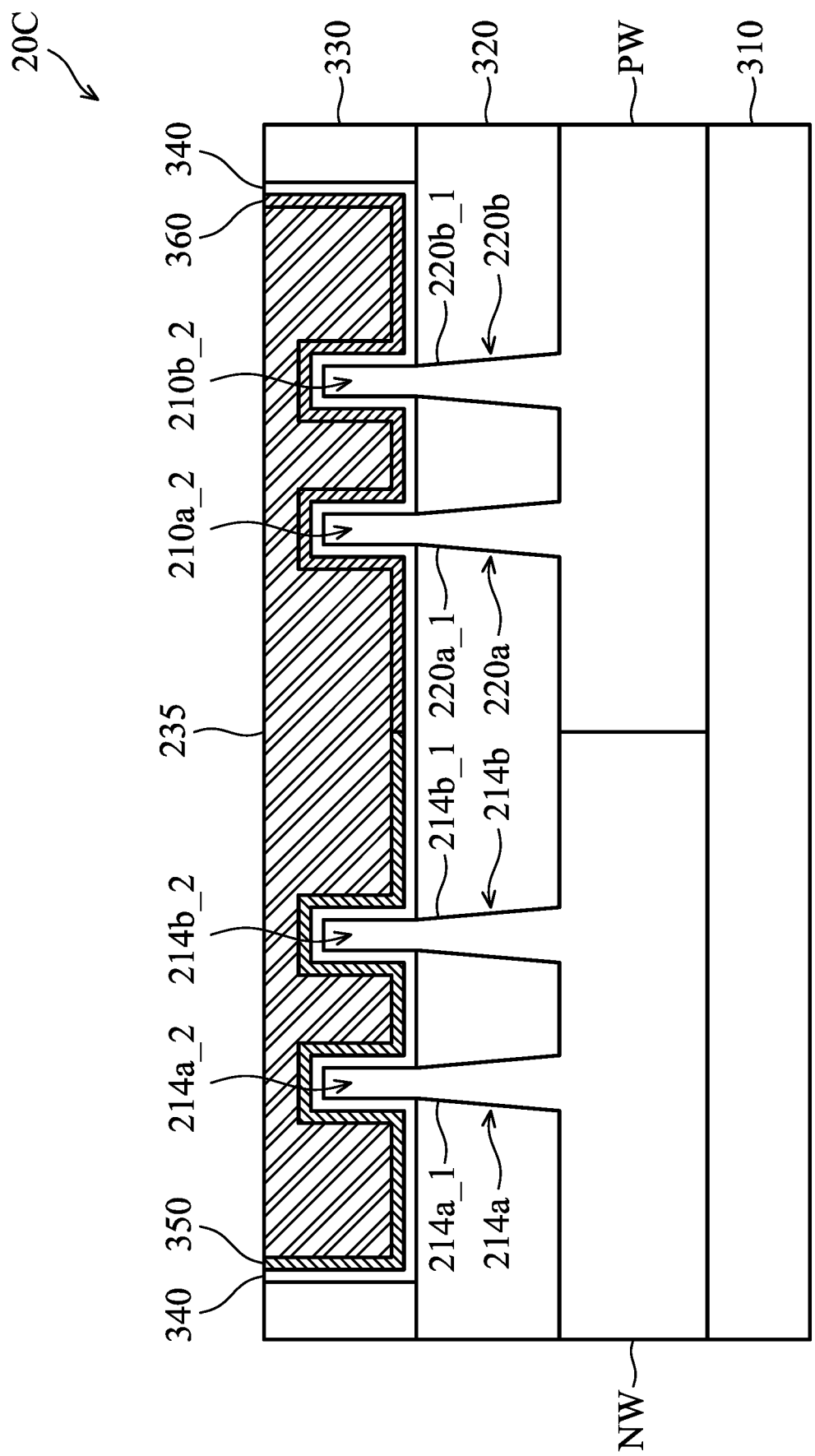
FIG. 8A illustrates a cross-sectional view of the semiconductor structure of the third logic cell along line G-GG in FIG. 7, in accordance with some embodiments of the disclosure.

FIG. 8A illustrates a cross-sectional view of the semiconductor structure of the third logic cell 20C along line G-GG in FIG. 7, in accordance with some embodiments of the disclosure. The semiconductor structure of the third logic cell 20C of FIG. 8A is similar to the semiconductor structure of the first logic cell 20A of FIG. 3A, and the difference between FIG. 8A and FIG. 3A is that the semiconductor fins 214a and 214b are formed on the N-type well region NW as shown in FIG. 8A. The semiconductor fin 214a includes a first portion 214a_1 and a second portion 214a_2 formed by the same material. Similarly, the semiconductor fin 214b includes a first portion 214b_1 and a second portion 214b_2 formed by the same material. Compared with the semiconductor fins 210a and 210b of FIG. 3A, the semiconductor fins 214a and 214b do not include Ge content. Furthermore, each of the semiconductor fins 214a and 214b overlapping the gate electrode 235, e.g., the second portions 214a_2 and 214b_2, may serve as a Si-base channel region of the third PMOS transistor MP3. Thus, the gate electrode 235 and the gate dielectrics 340 over the semiconductor fins 214a and 214b form a gate structure for the third PMOS transistor MP3.

Figure 8B:
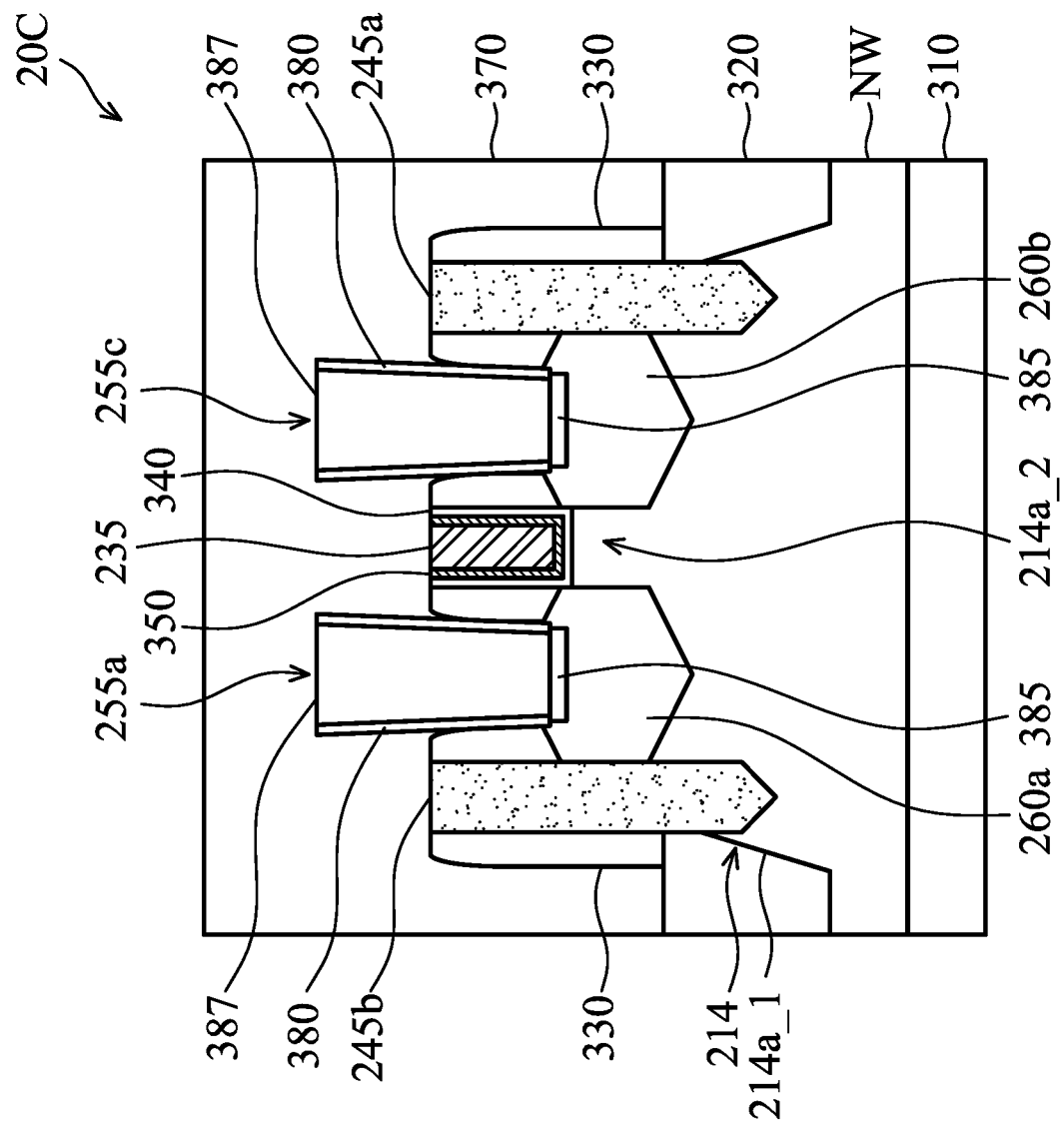
FIG. 8B illustrates a cross-sectional view of the semiconductor structure of the third logic cell along line H-HH in FIG. 7, in accordance with some embodiments of the disclosure.

FIG. 8B illustrates a cross-sectional view of the semiconductor structure of the third logic cell 20C along line H-HH in FIG. 7, in accordance with some embodiments of the disclosure. The semiconductor structure of the third logic cell 20C of FIG. 8B is similar to the semiconductor structure of the first logic cell 20A of FIG. 3B, and the difference between FIG. 8B and FIG. 3B is that the Si-base channel region corresponding to the second portion 214a_2 of the semiconductor fin 214a is formed between the source/drain regions 260a and 260b and under the gate electrode 235 as shown in FIG. 8B.

Furthermore, the first PMOS transistor MP1 of the first logic cell 20A and the third PMOS transistor MP3 of the third logic cell 20C have the same gate structure, such as the gate pitch, the gate critical dimension (CD), the gate dielectric layer (e.g., 340 of FIGS. 3B and 8B), and the work-function layer (e.g., 350 of FIGS. 3B and 8B).

Figure 8C:
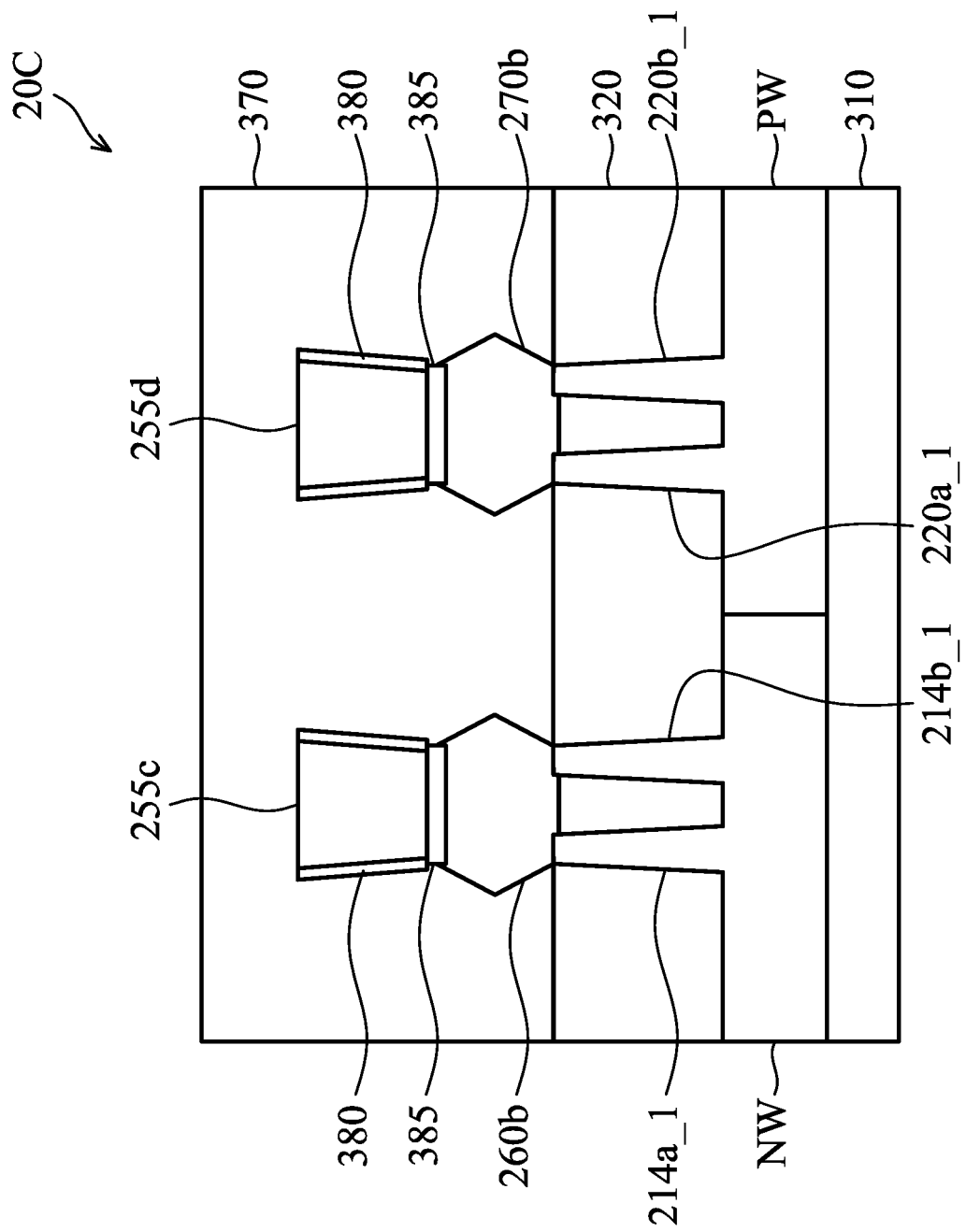
FIG. 8C illustrates a cross-sectional view of the semiconductor structure of the third logic cell along line I-II in FIG. 7, in accordance with some embodiments of the disclosure.

FIG. 8C illustrates a cross-sectional view of the semiconductor structure of the third logic cell 20C along line I-II in FIG. 7, in accordance with some embodiments of the disclosure. The semiconductor structure of the third logic cell 20C of FIG. 8C is similar to the semiconductor structure of the first logic cell 20A of FIG. 3C, and the difference between FIG. 8C and FIG. 3C is that the source/drain region 260*b* is formed on the first portions 214*a*_1 and 214*b*_1 of the semiconductor fins 214*a* and 214*b* as shown in FIG. 8B.

In some embodiments, the third PMOS transistor MP3 with the Si-base channel region can be implemented in a SRAM cell of the IC 100B. For example, the third PMOS transistor MP3 can be used as the pull-up transistor in a 6T SRAM cell. In some embodiments, the third PMOS transistor MP3 with the Si-base channel region can be implemented in an I/O cell of the IC 100B.

Figure 9:
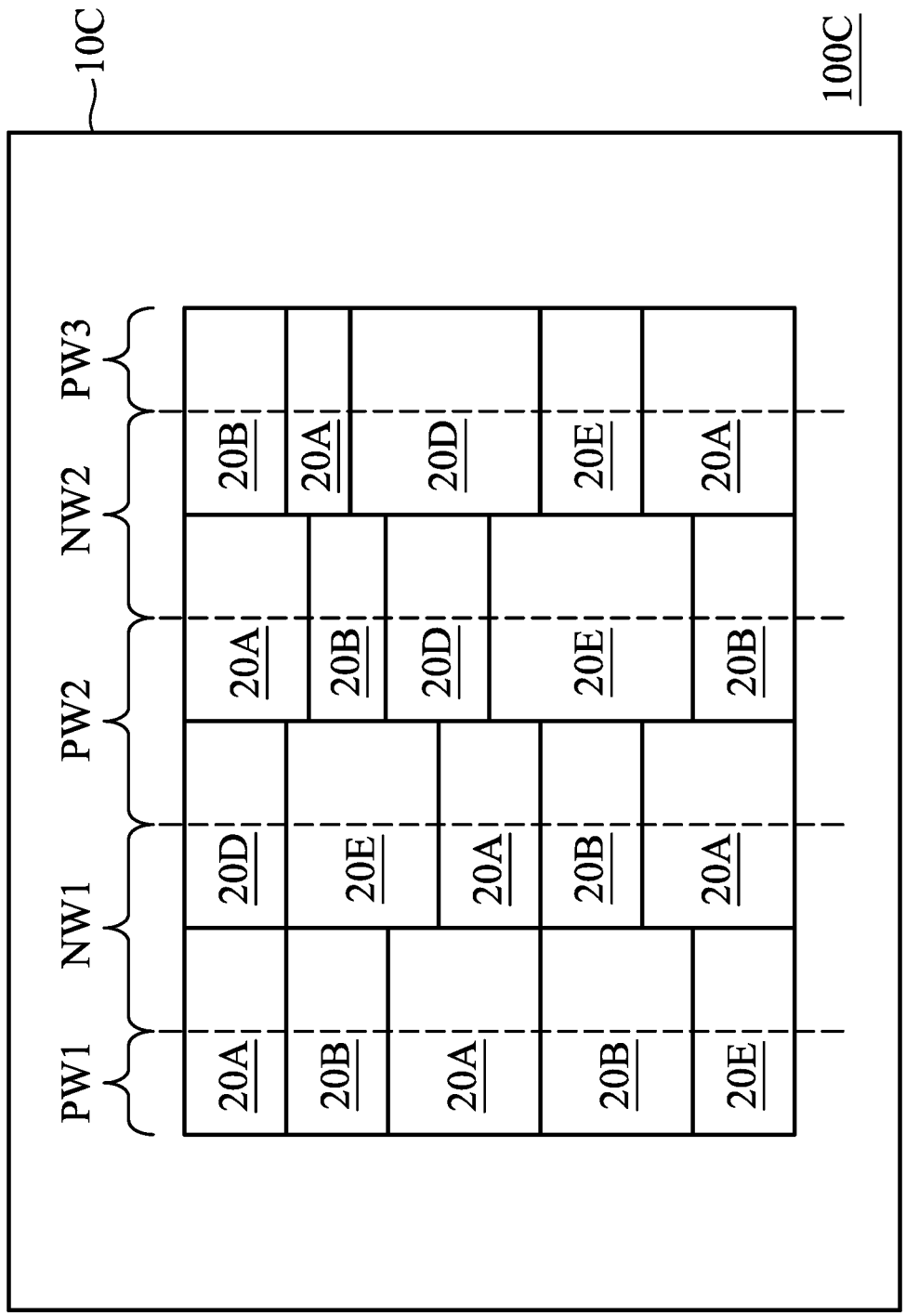
FIG. 9 is a simplified diagram of an IC, in accordance with some embodiments of the disclosure.

FIG. 9 is a simplified diagram of an IC 100C, in accordance with some embodiments of the disclosure. A logic circuit 10C of the IC 100C includes multiple first logic cells 20A, multiple second logic cells 20B, multiple fourth logic cells 20D, and multiple fourth logic cells 20E. The logic cells 20A, 20B, 20D and/or 20E can be arranged in the same column of the logic circuit 10C. Furthermore, the logic functions of the logic cells 20A, 20B, 20D, and 20E may be the same or different. In some embodiments, the first logic cells 20A, the second logic cells 20B, the fourth logic cells 20D and the fifth logic cells 20E corresponding to the same function or operation may have the same circuit configuration with different semiconductor structures for providing various threshold voltages (Vth or Vt). For example, the semiconductor structures of the PMOS and/or NMOS transistors of the first logic cells 20A, the second logic cells 20B, the fourth logic cells 20D, and the fifth logic cells 20E are different.

In some embodiments, the logic cells 20A, 20B, 20D and 20E are electrically isolated by the isolation region, e.g., STI. In some embodiments, the logic cells 20A, 20B, 20D and 20E are electrically isolated by the transistors.

Figure 10A:
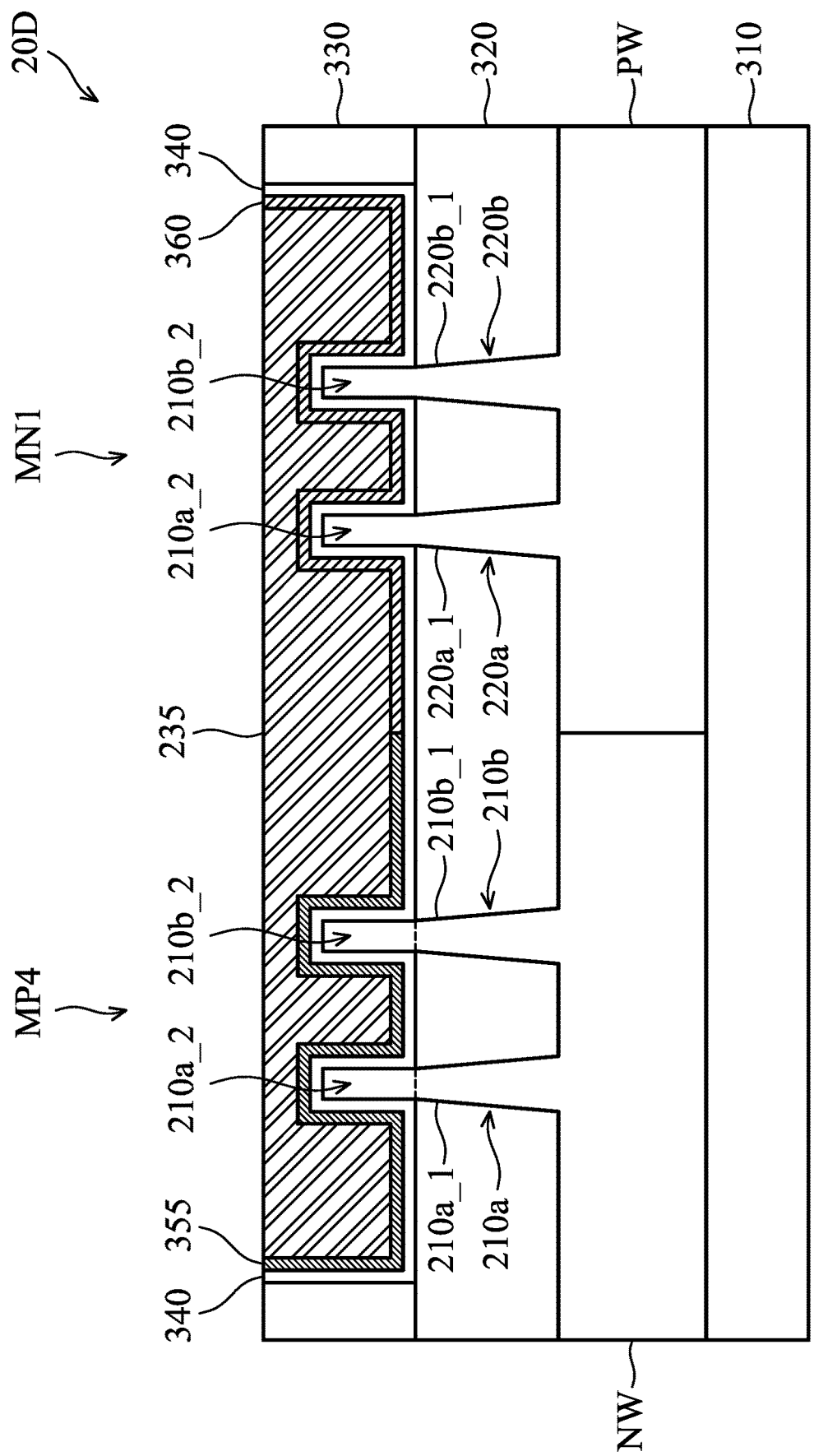
FIG. 10A illustrates a cross-sectional view of the semiconductor structure of the fourth logic cell, in accordance with some embodiments of the disclosure.

FIG. 10A illustrates a cross-sectional view of the semiconductor structure of the fourth logic cell 20D, in accordance with some embodiments of the disclosure. The semiconductor structure of the fourth logic cell 20D of FIG. 10A is similar to the semiconductor structure of the first logic cell 20A of FIG. 3A, and the fourth logic cell 20D includes the fourth PMOS transistor MP4 and the first NMOS transistor MN1. Furthermore, the difference between FIG. 10A and FIG. 3A is that a work-function layer 355 is between the gate dielectric layer 340 and the gate electrode 235 over the N-type well region NW. In some embodiments, the work-function layer 355 includes a P-type work-function metal. The P-type work-function metal includes titanium nitride (TiN), tungsten nitride (WN), tantalum nitride (TaN), ruthenium (Ru) or a combination thereof. In some embodiments, the work-function layer 355 includes multiple layers combination and selected from a group of TiN, TaN, TiAl, TiAlN, W, or a combination thereof. Due to the work-function characteristics of the work-function layers 350 and 355 being different, the threshold voltages of the PMOS transistor MP1 and MP4 with higher Ge atomic concentration of the SiGe channel region are different. For example, in some embodiments, the work-function layer 350 of the first PMOS transistor MP1 is within a range of 4.2 eV through 4.55 eV, and the work-function layer 355 of the fourth PMOS transistor MP4 is within a range of 4.56 eV through 4.9 eV, and the threshold voltage of the first PMOS transistor MP1 is greater than that of the fourth PMOS transistor MP4. In some embodiments, the work-function layer 350 of the first PMOS transistor MP1 and the work-function layer 355 of the fourth PMOS transistor MP4 are made of a similar work-function material with different concentrations or different dopants. For example, the Al concentration of the work-function layer 350 of the first PMOS transistor MP1 is greater than that of the work-function layer 355 of the fourth PMOS transistor MP4.

Figure 10B:
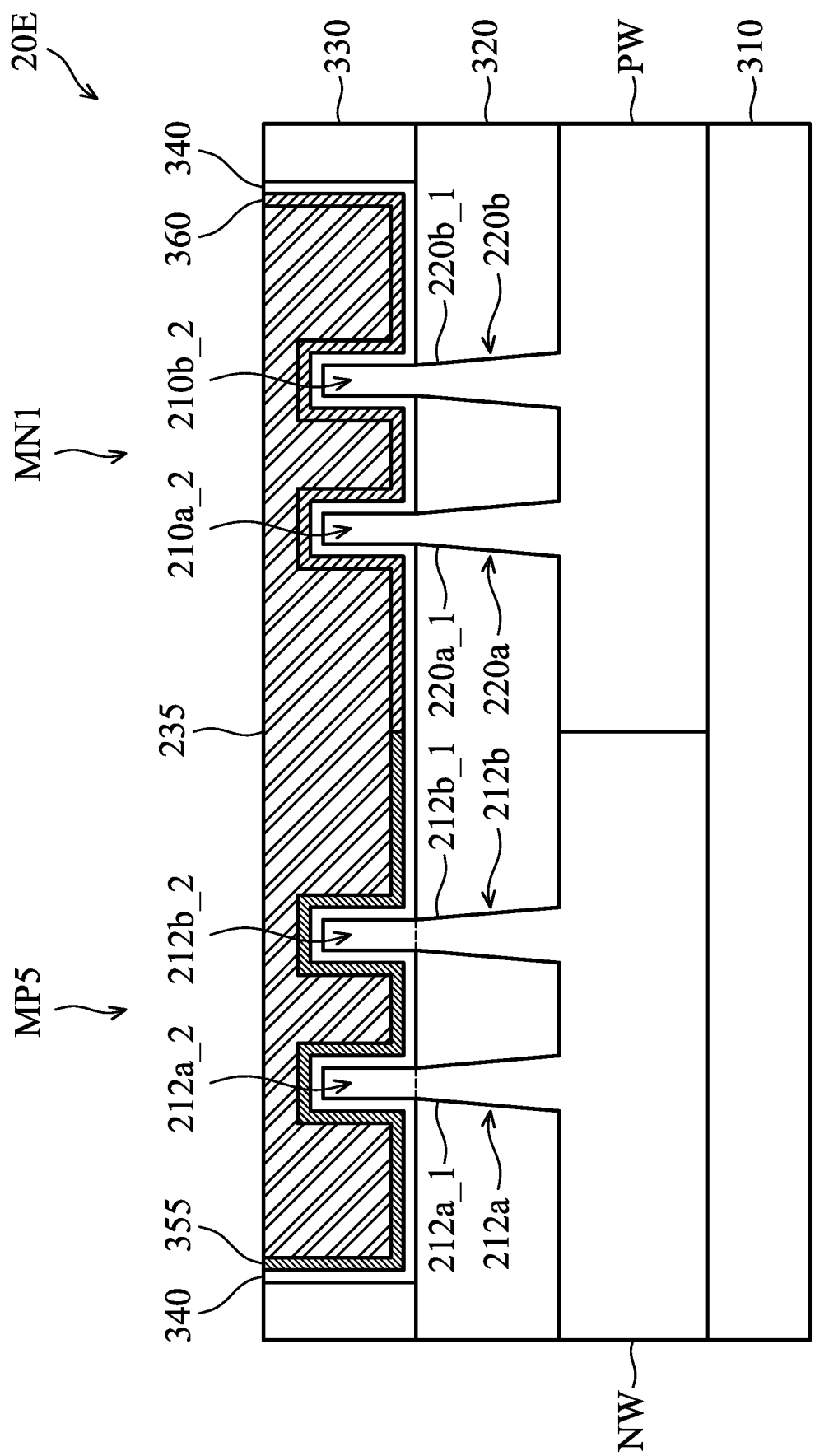
FIG. 10B illustrates a cross-sectional view of the semiconductor structure of the fifth logic cell, in accordance with some embodiments of the disclosure.

FIG. 10B illustrates a cross-sectional view of the semiconductor structure of the fifth logic cell 20E, in accordance with some embodiments of the disclosure. The semiconductor structure of the fifth logic cell 20E of FIG. 10B is similar to the semiconductor structure of the second logic cell 20B of FIG. 5A, and the fifth logic cell 20E includes the fifth PMOS transistor MP5 and the first NMOS transistor MN1. Furthermore, the difference between FIG. 10B and FIG. 5A is that a work-function layer 355 is between the gate dielectric layer 340 and the gate electrode 235 over the N-type well region NW. In some embodiments, the work-function layer 350 of the second PMOS transistor MP2 is within a range of 4.2 eV through 4.55 eV, and the work-function layer 355 of the fifth PMOS transistor MP5 is within a range of 4.56 eV through 4.9 eV. Due to the work-function characteristics of the work-function layers 350 and 355 being different, the threshold voltages of the PMOS transistor MP2 and MP5 with lower Ge atomic concentration of the SiGe channel region are different. For example, the threshold voltage of the second PMOS transistor MP2 is greater than that of the fifth PMOS transistor MP5. As described above, the work-function layer 350 of the second PMOS transistor MP2 and the work-function layer 355 of the fifth PMOS transistor MP5 are made of a similar work-function material with different concentrations or different dopants.

In some embodiments, the work-function layer 350 of the third PMOS transistor MP3 of the third logic cell 20C as shown in FIG. 8A can be replaced with the work-function layer 355, so as to form a sixth PMOS transistor MP6 (not shown). Similarly, the sixth PMOS transistor MP6 with the Si-base channel region can be implemented in a SRAM cell of an IC. For example, the sixth PMOS transistor MP6 can be used as the pull-up transistor in a 6T SRAM cell. In some embodiments, the sixth PMOS transistor MP6 with the Si-base channel region can be implemented in an I/O cell of an IC.

In some embodiments, the work-function layer 360 of the first NMOS transistor MN1 of the logic cells 20A through 20E can be replaced with another work-function layer, so as to form a second NMOS transistor MN2 (not shown). Therefore, the threshold voltages of the first NMOS transistor MN1 and MN2 are different due to different work-function layers.

FIG. 11 shows a table illustrating the relationship of the threshold voltage and the Ge atomic concentration of the PMOS transistors MP1 and MP2. As described above, the first PMOS transistor MP1 has the higher Ge atomic concentration of the SiGe channel region, and the second PMOS transistor MP2 has the lower Ge atomic concentration of the SiGe channel region. In some embodiments, the Ge atomic concentration of the SiGe channel region in the first PMOS transistor MP1 is within a range of 10.5% through 35%, and the Ge atomic concentration of the SiGe channel region in the second transistor MP2 is within a range of 3% through 10%. In FIG. 11, the threshold voltage Vt1 of the first PMOS transistor MP1 is less than the threshold voltage Vt2 of the second PMOS transistor MP2. Furthermore, the off-current Ioff1 of the first PMOS transistor MP1 is greater than the off-current Ioff2 of the second PMOS transistor MP2. In some embodiments, the Ge atomic concentration of the SiGe channel region in the first PMOS transistor MP1 is within a range of 15% through 35%, and the Ge atomic concentration of the SiGe channel region in the second transistor MP2 is within a range of 5% through 14.5%. Under the concentration condition, the threshold voltage Vt1 of the first PMOS transistor MP1 may be greater than the threshold voltage Vt2 of the second PMOS transistor MP2 by about 30 mV through 200 mV. Moreover, the off-current Ioff2 of the second PMOS transistor MP2 is less than half of the off-current Ioff1 of the first PMOS transistor MP1.

For the same work-function layer, by adjusting the Ge atomic concentration of the SiGe channel region in the PMOS transistors having the same gate structure, the PMOS transistors with various threshold voltages are formed for lower leakage or high speed requirement in the various circuits of an IC.

In some embodiments, the higher SiGe concentration channel PMOS transistors (e.g., MP1 and MP4) have lower threshold voltages and Ion/Ioff ratio is greater than 10%, and the higher SiGe concentration channel PMOS transistors can be implemented in a speed driven core logic circuit. In some embodiments, the lower SiGe concentration channel PMOS transistors (e.g., MP2 and MP5) have higher threshold voltages, and the lower SiGe concentration channel PMOS transistors can be used as the low standby PMOS device (e.g., both Ioff and junction leakage reduction) or I/O device.

FIG. 12 shows a table illustrating the relationship of the threshold voltage and the Ge atomic concentration of the PMOS transistors MP1, MP2, MP4 and MP5. As described above, the first PMOS transistor MP1 has the higher Ge atomic concentration of the SiGe channel region and a first work-function layer (e.g., the work-function layer 350), and the fourth PMOS transistor MP4 has the same higher Ge atomic concentration of the SiGe channel region and a second work-function layer (e.g., the work-function layer 355). Furthermore, the second PMOS transistor MP2 has the lower Ge atomic concentration of the SiGe channel region and the first work-function layer (e.g., the work-function layer 350), and the fifth PMOS transistor MP5 has the same lower Ge atomic concentration of the SiGe channel region and the second work-function layer (e.g., the work-function layer 355). In some embodiments, the Ge atomic concentration of the SiGe channel region in the PMOS transistors MP1 and MP4 is within a range of 10.5% through 35%, and the Ge atomic concentration of the SiGe channel region in the transistors MP2 and MP5 is within a range of 3% through 10%. In some embodiments, the Ge atomic concentration of the SiGe channel region in the PMOS transistors MP1 and MP4 is within a range of 10.5% through 35%, and the Ge atomic concentration of the SiGe channel region in the PMOS transistors MP2 and MP5 is within a range of 3% through 10%. In FIG. 12, the threshold voltage Vt1 of the first PMOS transistor MP1 is less than the threshold voltage Vt2 of the second PMOS transistor MP2.

In some embodiments, the first work-function layer of the PMOS transistors MP1 and MP2 is within a range of 4.2 eV through 4.55 eV, and the work-function layer of the PMOS transistors MP4 and MP5 is within a range of 4.56 eV through 4.9 eV. In FIG. 12, the threshold voltage Vt1 of the first PMOS transistor MP1 is greater than the threshold voltage Vt3 of the fourth PMOS transistor MP4, e.g., Vt3=Vt1−ΔVt. Furthermore, the threshold voltage Vt2 of the second PMOS transistor MP2 is greater than the threshold voltage Vt4 of the fifth PMOS transistor MP5, e.g., Vt4=Vt2−ΔVt. Therefore, by using two work-function layers stack with two different SiGe concentration channel, four PMOS transistors with different threshold voltages are formed. Furthermore, compared with doping the channel of the PMOS transistors to tune various threshold voltages, for example, higher threshold voltage, better threshold voltage mis-match (AVt) is provided due to no very heavy channel species (3~10× than conventional planar devices) are doped, thereby avoiding worse device variation and SRAM minimum voltage operation fail.

Embodiments for semiconductor structures are provided. By adjusting the Ge atomic concentration of the SiGe channel region in the PMOS transistors having the same gate structure, the PMOS transistors with various threshold voltages are formed for lower leakage or high speed requirement in various logic circuits. Furthermore, by using multiple work-function layers stack with different SiGe concentration channel, the transistors with different threshold voltages are formed. The transistors with various threshold voltages can be implemented in the logic cells, SRAM cell and/or I/O cell for various applications, such as lower leakage, high speed, and so on.

In some embodiments, a semiconductor structure is provided. The semiconductor structure includes a first P-type transistor including a first SiGe channel region, and a second P-type transistor including a second SiGe channel region. The first SiGe channel region has higher Ge atomic concentration than the second SiGe channel region. The first and second P-type transistors are formed in the same N-type well region.

In some embodiments, a semiconductor structure is provided. The semiconductor structure includes a first P-type transistor including a first SiGe channel region, a second P-type transistor including a second SiGe channel region, and a third P-type transistor including a Si-base channel region free of Ge. The first SiGe channel region has higher Ge atomic concentration than the second SiGe channel region. The first, second and third P-type transistors are formed in the same N-type well region.

In some embodiments, a semiconductor structure is provided. The semiconductor structure includes a first P-type transistor including a first SiGe channel region, a second P-type transistor including a second SiGe channel region, a third P-type transistor including a third SiGe channel region, and a fourth P-type transistor including a fourth SiGe channel region. The Ge atomic concentration of the first and third SiGe channel regions are identical, and higher than Ge atomic concentration of the second and fourth SiGe channel regions. The first and second channel regions are covered by a first work-function layer, and the third and fourth channel regions are covered by a second work-function layer different from the first work-function layer.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a first P-type transistor comprising a first SiGe channel region corresponding to a SiGe portion of a first semiconductor fin; and
a second P-type transistor comprising a second SiGe channel region corresponding to a SiGe portion of a second semiconductor fin;

wherein the first SiGe channel region has higher Ge atomic concentration than the second SiGe channel region, wherein the first and second P-type transistors are formed in the same N-type well region, wherein the first semiconductor fin is separated from the second semiconductor fin by a dummy gate, wherein an interface between the SiGe portion and a non-SiGe portion of the first semiconductor fin and an interface between the SiGe portion and a non-SiGe portion of the second semiconductor fin are substantially level with a top surface of a shallow trench isolation.

2. The semiconductor structure as claimed in claim 1, wherein the Ge atomic concentration of the first SiGe channel region is within a range of 15% to 35%, and the Ge atomic concentration of the second SiGe channel region is within a range of 5% to 14.5%.

3. The semiconductor structure as claimed in claim 1, wherein the Ge atomic concentration of the first SiGe channel region is within a range of 10.5% to 35%, and the Ge atomic concentration of the second SiGe channel region is within a range of 3% to 10%.

4. The semiconductor structure as claimed in claim 1, further comprising:
a SRAM cell,
wherein the second P-type transistor is implemented in the SRAM cell.

5. The semiconductor structure as claimed in claim 1, further comprising:
an I/O cell,
wherein the second P-type transistor is implemented in the I/O cell.

6. The semiconductor structure as claimed in claim 1, wherein source/drain regions of the first and second P-type transistors are formed by SiGe with Boron dopant, and the Ge atomic concentration of the source/drain regions of the first and second P-type transistors is higher than the Ge atomic concentrations of the first and second SiGe channel regions.

7. The semiconductor structure as claimed in claim 1, further comprising:
a plurality of N-type transistors,
wherein source/drain regions of the N-type transistors comprises at least one material selected from a group consisting of SiP, SiC, SiPC, SiAs, Si, and combinations thereof.

8. The semiconductor structure as claimed in claim 1, wherein the Ge atomic concentration of source/drain regions of the first and second P-type transistors is within a range of 36% to 85%.

9. The semiconductor structure as claimed in claim 1, wherein the first P-type transistor is implemented in a first standard cell and the second P-type transistor is implemented in a second standard cell, and the first and second standard cells are electrically isolated by a dielectric-base gate, wherein the first semiconductor fin is separated from the second semiconductor fin by the dielectric-base gate.

10. A semiconductor structure, comprising:
a plurality of dielectric-base gates;
a first P-type transistor comprising a first gate structure and a first semiconductor fin; and
a second P-type transistor comprising a second gate structure and a second semiconductor fin,
wherein the dielectric-base gates are located upon edges of the first and second semiconductor fins,
wherein each of the first and second semiconductor fins is divided into a first portion that is free of SiGe content and a second portion with SiGe content,
wherein the second portion of the first semiconductor fin has higher Ge atomic concentration than the second portion of the second semiconductor fin,
wherein the second portion of the first semiconductor fin is surrounded by the first gate structure, and the second portion of the second semiconductor fin is surrounded by the second gate structure.

11. The semiconductor structure as claimed in claim 10, wherein the Ge atomic concentration of the second portion of the first semiconductor fin is within a range of 15% to 35%, and the Ge atomic concentration of the second portion of the second semiconductor fin is within a range of 5% to 14.5%.

12. The semiconductor structure as claimed in claim 10, wherein the Ge atomic concentration of the second portion of the first semiconductor fin is within a range of 10.5% to 35%, and the Ge atomic concentration of the second portion of the second semiconductor fin is within a range of 3% to 10%.

13. The semiconductor structure as claimed in claim 10, further comprising:
a SRAM cell; and
an I/O cell,
wherein the second P-type transistor is implemented in the SRAM cell or the I/O cell.

14. The semiconductor structure as claimed in claim 10, wherein source/drain regions of the first and second P-type transistors are formed by SiGe with Boron dopant, and the Ge atomic concentration of the source/drain regions of the first and second P-type transistors is higher than the Ge atomic concentrations of the second portions of the first and second semiconductor fins.

15. A semiconductor structure, comprising:
a dielectric-base gate;
a first logic cell, comprising:
a P-type transistor comprising a first SiGe channel region corresponding to a SiGe portion of a first semiconductor fin; and
a second logic cell, comprising:
a second P-type transistor comprising a second SiGe channel region corresponding to a SiGe portion of a second semiconductor fin;
wherein the first SiGe channel region has higher Ge atomic concentration than the second SiGe channel region,
wherein the first and second logic cells are formed in the same N-type well region and the same P-type well region,
wherein the first logic cell is separated from the second logic cell by the dielectric-base gate,
wherein an interface between the SiGe portion and a non-SiGe portion of the first semiconductor fin and an interface between the SiGe portion and a non-SiGe portion of the second semiconductor fin are substantially level with a top surface of a shallow trench isolation.

16. The semiconductor structure as claimed in claim 15, wherein the first logic cell further comprises:
a first N-type transistor comprising a first channel region free of Ge content,
and the second logic cell further comprises:
a second N-type transistor comprising a second channel region free of Ge content.

17. The semiconductor structure as claimed in claim 15, wherein the Ge atomic concentration of source/drain regions of the first and second P-type transistors is within a range of 36% to 85%.

18. The semiconductor structure as claimed in claim 15, wherein the first and second logic cells are electrically isolated by the dielectric-base gate.

19. The semiconductor structure as claimed in claim 15, wherein the Ge atomic concentration of the first SiGe channel region is within a range of 15% to 35%, and the Ge atomic concentration of the second SiGe channel region is within a range of 5% to 14.5%.

20. The semiconductor structure as claimed in claim 15, wherein the Ge atomic concentration of the first SiGe channel region is within a range of 10.5% to 35%, and the Ge atomic concentration of the second SiGe channel region is within a range of 3% to 10%.

* * * * *